US008914689B2

(12) United States Patent
Marinissen et al.

(10) Patent No.: US 8,914,689 B2
(45) Date of Patent: Dec. 16, 2014

(54) CONTROLLED TOGGLE RATE OF NON-TEST SIGNALS DURING MODULAR SCAN TESTING OF AN INTEGRATED CIRCUIT

(75) Inventors: Erik Jan Marinissen, Leuven (BE); Sergej Deutsch, Durham, NC (US)

(73) Assignees: Cadence Design Systems, Inc., San Jose, CA (US); IMEC, Leuven (BE)

( * ) Notice: Subject to any disclaimer, the term of this patent is extended or adjusted under 35 U.S.C. 154(b) by 66 days.

(21) Appl. No.: 13/619,248

(22) Filed: Sep. 14, 2012

(65) Prior Publication Data

US 2014/0082421 A1 Mar. 20, 2014

(51) Int. Cl.
*G01R 31/28* (2006.01)
(52) U.S. Cl.
USPC ............................ 714/724; 714/726; 714/728
(58) Field of Classification Search
CPC ........... G01R 31/31704; G01R 31/317; G01R 31/318558; G01R 31/318552
USPC ......................................... 714/724, 726, 728
See application file for complete search history.

(56) References Cited

U.S. PATENT DOCUMENTS

2006/0242506 A1* 10/2006 Warnock et al. ............... 714/726
2009/0070646 A1* 3/2009 Wang et al. .................... 714/728

OTHER PUBLICATIONS

"IEEE Std 1500TM-2005", IEEE Standard Testability Method for Embedded Core-based Integrated Circuits. IEEE, New York, NY, USA, (Aug. 2005), 128 pgs.
Da Silva, Francisco, "", The Core Test Wrapper Handbook—Rationale and Application of IEEE Std. 1500TM, vol. 35 of Frontiers in Electronics Testing., Springer-Verlag, Boston, MA, USA, (2006).
Deutsch, S., et al., "Automation of 3D-DfT Insertion", 2011 20th Asian Test Symposium (ATS), (2011), 395-400.
Fan, X, et al., "Max-Fill: A Method to Generate High Quality Delay Tests", Design and Diagnostics of Electronic Circuits & Systems (DDECS), (2011), 375-380.
Marinissen, E. J, et al., "3D DfT architecture for pre-bond and post-bond testing", (2010), 1-8.
Marinissen, E. J, et al., "A structured and scalable test access architecture for TSV-based 3D stacked ICs", 2010 28th VLSI Test Symposium (VTS), , (2010), 269-274.
Marinissen, E. J, et al., "Status Report of IEEE P1838—Standard for Test Access Architecture for Three-Dimensional Stacked Integrated Circuits", In Proceedings IEEE International Test Conference (ITC'11), Anaheim, California, (Sep. 2011).
Matunaga, S., et al., "Concept and Analysis of TugRobot Satellites for In-Orbit Servicing", 47th Congress of the International Astronautical Federation, (1996), IAF-96-A.6.02.
Pendurkar, Rajesh, et al., "Switching Activity Generation with Automated BIST Synthesis for Performance Testing of Interconnects", IEEE Transactions on Computer-Aided Design of Integrated Circuits and Systems, 20(9), (Sep. 2001), 1143-1158.
Pomeranz, Irith, et al., "Design-for-Testability for Synchronous Sequential Circuits that Maintains Function Switching Activity", 21st International Conference on VLSI Design, (2008), 181-186.

* cited by examiner

*Primary Examiner* — Sam Rizk
(74) *Attorney, Agent, or Firm* — Dickstein Shapiro LLP

(57) ABSTRACT

A method is provided to test a modular integrated circuit (IC) comprising: testing a module-under-test (MUT) within the IC while causing a controlled toggle rate within a first neighbor module of the MUT; wherein the controlled toggle rate within the first neighbor module is selected so that toggling within the first neighbor module has substantially the same effect upon operation of the MUT that operation of the first neighbor module would have during actual normal functional operation of the first neighbor module.

32 Claims, 19 Drawing Sheets

CONTROLLED TOGGLE RATE OF NON-TEST SIGNALS DURING MODULAR SCAN TESTING OF AN INTEGRATED CIRCUIT

BACKGROUND

Integrated circuits (ICs) are growing in complexity and in the amount of circuitry that they integrate in a single product. In order to handle their complexity, their design is increasingly done in a modular fashion. Not only small design units such as standard library cells are reused, but also larger design modules often referred to as 'cores' are used and re-used as pre-designed components in 'system-on-chip' (SOC) design to ease the overall design integration effort. With the advent of 2.5D- and 3D-Stacked ICs (SICs) also the manufacturing is moving to a modular approach, with benefits in performance, power dissipation, and yield.

As the IC manufacturing process consists of many high-precision and hence defect-prone steps, raw manufacturing yields are unacceptably low for IC users. Consequently, every IC needs to be tested for manufacturing defects before it is being shipped to the customer. Testing of large and complex (2D) SOCs, 2.5D-SICs, and 3D-SICs is increasingly done in a modular fashion as well. In this modular test approach, the various design modules (e.g., stacked dies, embedded cores) are tested as stand-alone units. In addition, the interconnect wiring and logic in between the various modules are tested. A modular test approach has benefits for both test development and test application. Different circuit structures (e.g., digital logic, DRAM, SRAM, analog, FPGA) exhibit different defect behavior and hence may require dedicated test pattern generation; this is enabled by a modular test approach. Black-boxed third-party Intellectual Property (IP) cores require a modular approach, as the design content of the IP core is not available to the system-chip integrator, and hence he/she needs to work with test patterns generated by the core provider. A modular test approach also allows for Divide-and-Conquer test generation, which reduces the test development time as well as the test application time. For 2.5D- and 3D-SICs, additional benefits of a modular test approach include yield monitoring, first-order fault diagnosis, and flexible test scheduling (inclusion, exclusion, and re-ordering of module tests) on the test floor; the latter feature is especially attractive when manufacturing yields mature over time.

Modular testing requires an on-chip Design-for-Test (DfT) architecture, in which the various modules are equipped with dedicated test circuitry. This test circuitry provides test controllability and observability at the module's I/Os. For embedded cores, a standardized test wrapper has been proposed pursuant to IEEE Std 1500. For 2.5D and 3D-SICs, a 3D-DfT architecture based on die-level wrappers is currently being considered for standardization by the IEEE 3D-Test Working Group as IEEE P1838. A modular DfT architecture allows one or multiple Modules-Under-Test (MUTs) to be tested simultaneously.

In general, manufacturing defects can only be detected by switching the circuit. As there often is a need to minimize the test application time, test generation focuses on getting high fault coverage with a small number of test patterns which results in a high switching activity of the circuit in a test mode. Whereas in a functional mode of operation perhaps on average only 10% of the sequential storage elements (e.g., flip-flops) are switching from one clock cycle to the next, during testing there can easily be 30% to 50% switching activity per clock cycle. The power grid of a chip, which is typically dimensioned for functional operation only, might not be able to handle the large switching activity during test. Consequently, an IC might fail a test unjustifiably ("false reject") or it might be permanently damaged due to excessive switching activity ("brown-out"), both resulting in lower yields. One counter-measure is to lower the test frequency, but this inhibits detection of timing defects ("at-speed testing") and increases the test application time. Another counter-measure is Power-Aware ATPG (Automatic Test Pattern Generation), in which patterns are generated such that the switching activity of the test is explicitly reduced below a user-defined maximum. For example, exploiting the many "don't care" bits in ATPG patterns with the so-called "repeat fill" strategy, the switching activity during test can be significantly reduced without increasing the test pattern count. In order to achieve really low switching activity levels, it will typically be required to increase the test pattern count.

The above-described counter-measures against false rejects and "brown-out" pertain to the actual Module-Under-Test (MUT) itself. However, in a modular test set-up, there is concern not only about the level of switching activity in the MUT, but also about the level of switching activity in the modules neighboring to the MUT. If those neighbor modules switch too much, even if they are momentarily not tested themselves but only serve to transport test stimuli and/or responses to the MUT(s), the test result for the MUT(s) can still be affected. A common counter-measure is to quiet the neighboring modules, e.g., by switching off their scan chains. Unfortunately, although this solution addresses the problem of false rejects or "brown-out", it might provide a too-optimistic test environment for the MUT(s) and consequently lead to (even more expensive) test escapes ("false positives").

SUMMARY

In one aspect, a method to test a modular integrated circuit (IC) includes testing a module-under-test (MUT) within the IC while causing a controlled toggle rate within a first neighbor module of the MUT.

In another aspect, an integrated circuit includes a module-under-test (MUT). A neighbor module includes a toggle generator and a plurality of state elements. The toggle generator is configured to impart a toggle pattern to the plurality of state elements to cause a controlled toggle rate within the neighbor module. The controlled toggle rate within the neighbor module is selected so that toggling within the neighbor module has substantially the same effect upon operation of the MUT that operation of the neighbor module is expected to have during actual normal functional operation of the first neighbor module.

In yet another aspect, an integrated circuit comprises a first module that includes a first scan chain, a scan-in port, a toggle generator and a first switch coupled to selectably couple the scan-in port or a toggle generator output to an input of the first scan chain.

BRIEF DESCRIPTION OF THE DRAWINGS

Some embodiments are illustrated by way of example and not limitation in the figures of the accompanying drawings in which.

DESCRIPTION OF EMBODIMENTS

Figure 1:
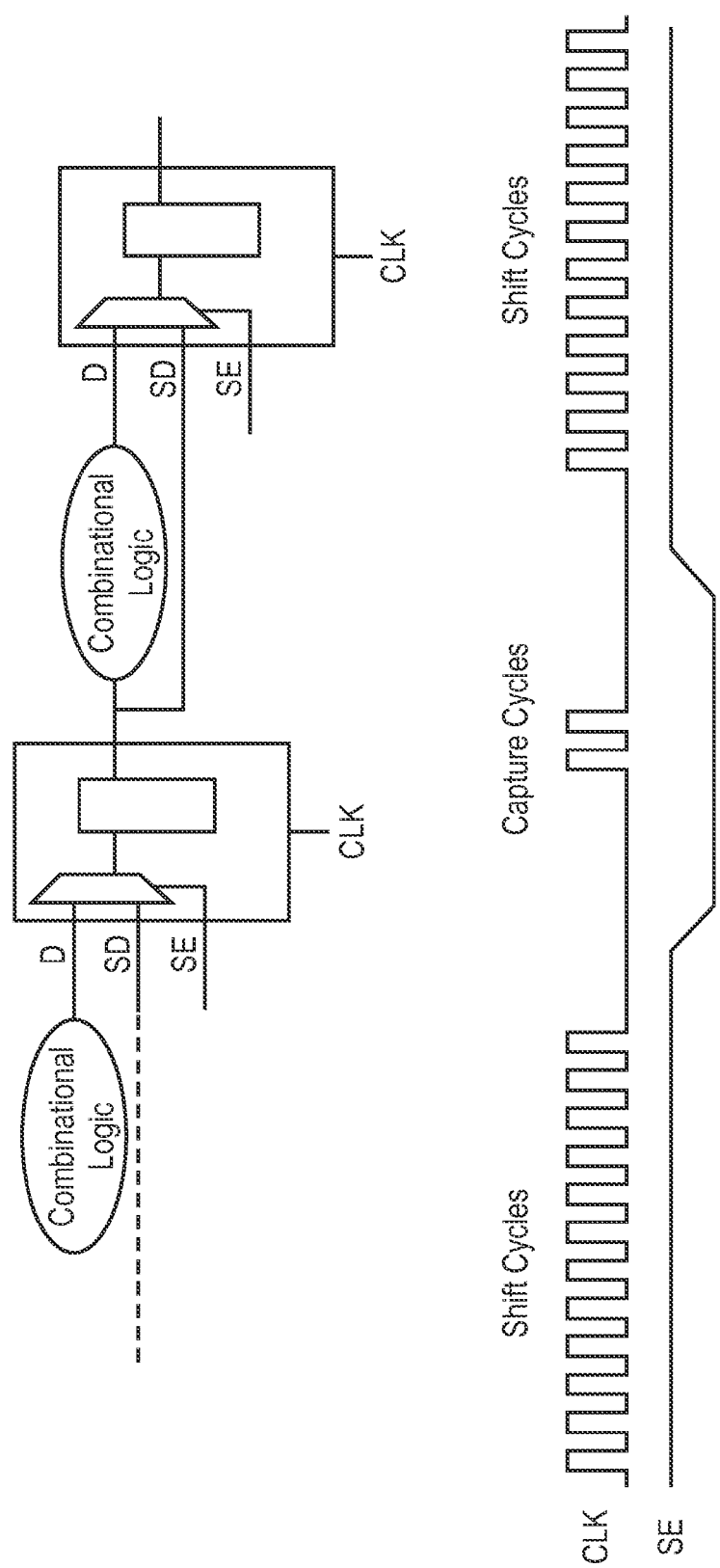
FIG. 1 is an illustrative drawing of a portion of an integrated circuit including two scan cells and generic combinational logic and showing shift and capture timing signals.

The following description is presented to enable any person skilled in the art to make and use a system and method of scan testing a multi-module system in which storage elements of neighbor modules of a Module-Under-Test actively toggle at a selected toggle rate. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skilled in the art will realize that the invention might be practiced without the use of these specific details. In other instances, well-known structures and processes are shown in block diagram form in order not to obscure the description of the invention with unnecessary detail. Components in the drawings that are substantially identical to components in different drawings are labeled with identical reference numerals. Thus, the present invention is not intended to be limited to the embodiments shown, but is to be accorded the widest scope consistent with the principles and features disclosed herein.

Scan Circuitry and Scan Mode Operation

As integrated circuits have become more complex and densely packed with gates, they have become progressively more difficult to test for manufacturing defects. As a result, testability has become an increasingly more important and challenging goal of the integrated circuit design process. One approach to improve the testability of an IC is to replace certain storage elements such as flip-flops with special memory cells, called scan elements. Scan elements allow application of test vectors to certain portions of an integrated circuit produced according to the design.

An automatic test pattern generation (ATPG) process produces test vectors, also referred to as ATPG patterns. A suitable set of test vectors can demonstrate the absence of certain manufacturing defects. ATPG-style test operation involves loading a test pattern to a set of scan cells of an integrated circuit. The circuit performs one or more functional cycles so as to cause the stored test pattern values to drive combinational logic to produce new values that are captured by the scan elements. The values stored in the scan elements after the one or more functional cycles are observed and compared with expected values to evaluate whether the circuit has a fault.

FIG. 1 is an illustrative drawing of a portion of an integrated circuit including two scan cells and generic combinational logic and showing shift and capture timing signals. A typical scan element comprises a dual purpose state element that can operate as a functional element in a circuit design during normal circuit operation, and alternatively, can operate as a unit of a serial scan-shift register during scan mode operation. In some embodiments, a scan element is implemented as an edge-triggered flip-flop with a two-way multiplexer (scan mux) to select between a system data D input (during function/capture mode operation) and scan-data SD input (during scan mode operation). The scan mux typically is controlled by a single control called a scan enable (SE) that selects between the scan-data (SD) and the functional data (D). Scan-data is transported from/to test equipment (not shown) by a serial shift operation. To that effect, the scan elements are connected into serial shift register strings called scan chains. It is not unusual for a scan chain to include hundreds or even thousands of individual scan elements, although only two are shown in this simplified illustrative drawing. The scan-in port of each scan cell in the chain is either connected to an external input (scan-in) for the first element in the chain or to the output of a single predecessor element in the chain. The output from the last scan element in the chain is connected to an external output (scan-out) port.

During scan mode operation, the SE control provides a logic value that causes the scan multiplexers to select the scan-data input (SD). For example, during first scan shift cycles test data are serially shifted in one bit at a time, from one scan element to the next in the chain. The test data follow the scan paths that bypass the combinational logic circuitry interposed between scan elements. Depending upon the length of the scan chain, hundreds or even thousands of clock cycles may be required to shift an entire test pattern through the scan chains.

Once an entire ATPG pattern has been loaded into the scan chain, the scan cells typically operate for one clock cycle in the capture mode. In that one clock cycle, the scanned-in test stimuli are released through the combinational logic, and the test responses from that combinational logic are captured back into the scan chain.

Following the capture cycles, the SE control values are changed to cause the scan elements to select the scan-data (SD) input. During second shift cycles, the captured data values are shifted out of the scan chain for evaluation scan. It will be appreciated that testing ordinarily involves numerous different ATPG patterns used to test for numerous different potential faults. In order to speed the testing process, a next ATPG pattern may be shifted in to the chain from test equipment, simultaneously with shift-out of previously captured (i.e. observed) data to the test equipment for evaluation. Thus, during the illustrated first scan shift cycles, while a new ATPG pattern is being shifted in to the scan chain, previously captured data may be shifted out for evaluation. Similarly, during second scan shift cycles, as the data captured in response to the first scanned-in data is shifted out, a next ATPG pattern can be shifted in.

Scan Testing of Modular Integrated Circuits

Figure 2:
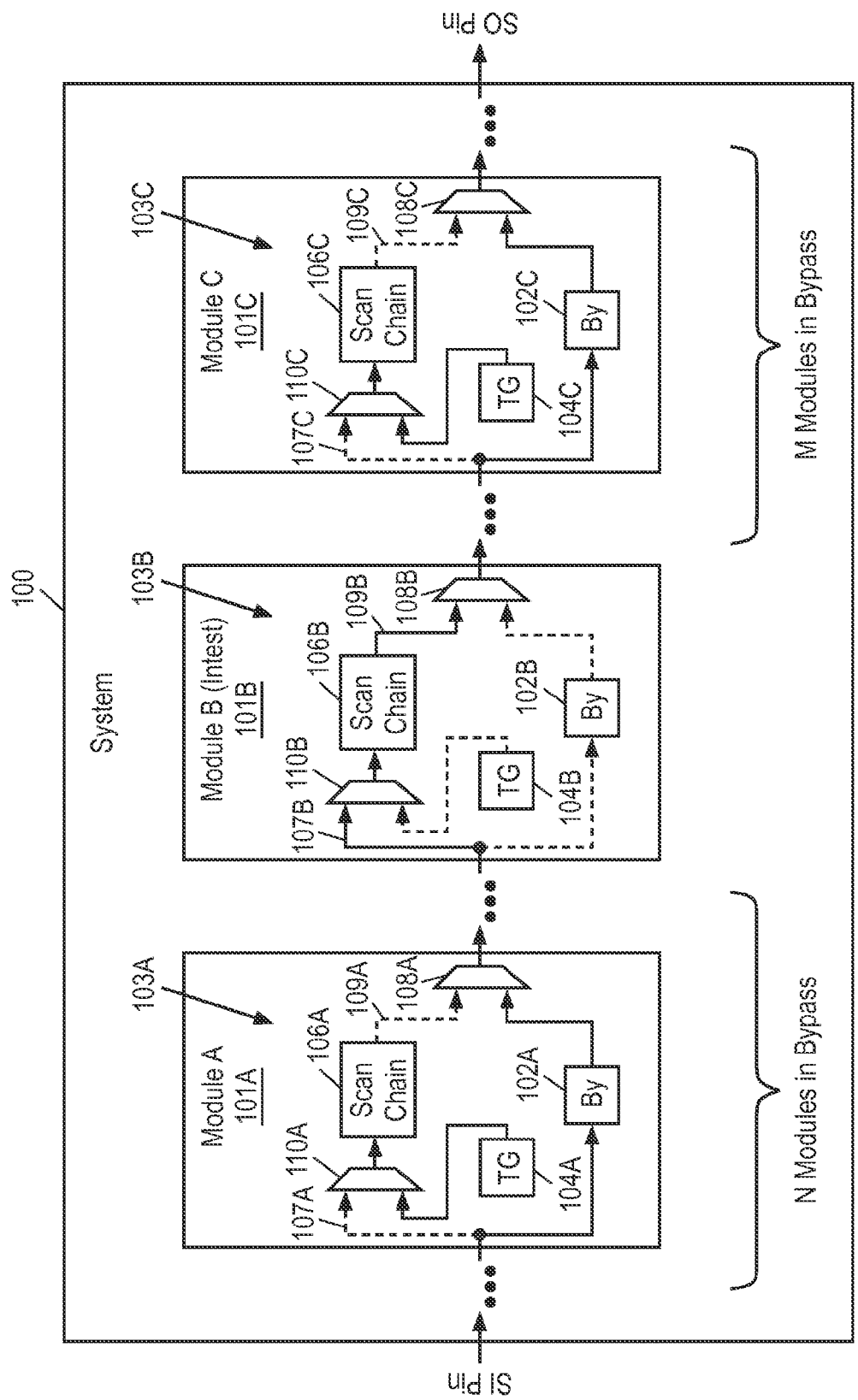
FIG. 2 is an illustrative drawing representing a modular integrated circuit (IC) configured to use a scan chain to test a module under test and to use toggle generators to achieve a controlled toggle rate in neighbor modules in accordance with some embodiments.

FIG. 2 is an illustrative drawing representing a modular integrated circuit (IC) in accordance with some embodiments. The modular IC may be a system on a chip (SOC) that includes multiple modules. The modular IC may be a stacked IC (SIC) that includes multiple modules. The modular IC may be a combination SOC/SIC. SOC/SIC 100 includes three example modules: module A, module B and module C. From a test perspective, module B is disposed between modules A and C. In a 2D layout, modules and their cores are laid out in the same horizontal plane. In a 3D stacked layout, modules are stacked vertically. In a 2.5D design, some modules are laid out horizontally relative to each other and others are stacked vertically relative to each other.

Each of modules A-C comprises functional circuitry referred to as a 'core' 101A-101C that is integrated with other cores within the SOC/SIC. Different cores may perform different functions. A core may comprise a unit of logic such as a processing unit or an interface unit or a storage unit, analog or mixed signal circuitry, a macrocell, or chip layout design unit or some combination of these, for example.

Modules A-C also include test circuitry 103A-103C used to test the cores. Scan chains 106A-106C impart test data to/from a MUT. Bypass circuitry 102A-102C bypass the scan chains of cores that currently are not MUTs. Toggle generators (TGs) 104A-104C impart toggles to respective scan chains of cores that currently are not MUTs so as to produce a selected levels of switching behavior in those modules that are not under test.

It will be appreciated that each module will at some point in time be a/the Module-Under-Test, and at other points in time be a neighboring module, physically neighboring another module that is currently MUT. Each module typically has different test modes such as: a functional (non-test) mode; an intest (internal-test) mode (in which the module itself is tested); an extest (external-test) mode (in which logic/wiring outside this module, but in between this module and another module, is tested); and (4) a bypass mode (in which this module passes on test stimuli for and/or responses from another module that currently is MUT. As used herein, 'neighbor' module may signify a module that is in the vicinity of the MUT and that may have an effect on a state element within the MUT such as power delivery, thermal coupling and/or noise interference, for example. A neighbor module may be a direct neighbor, physically adjacent to the MUT, but also somewhat more physically distant neighbor on the same die, or even on another die in a 3D die stack, for example.

Operation of the SOC/SIC 100 is explained for testing during which module B is the MUT. As used herein, the term 'toggle rate' signifies a percentage of the total number of sequential storage elements that toggle within some selected time interval. Circuitry in FIG. 2 that is shown in dashed lines is not operative during the testing of the core 101B of module B. Specifically, during scan mode operation of module B, switch 110B selects input from the module's scan-in port 107B for provision to scan chain 106B, and switch 108B selects input from an output of scan chain 106B for provision to the module's scan-out port 109B. Meanwhile, modules A and C are in toggle mode operation in which respective switches 110A, 110C select non-test signal inputs from toggle generators 104A, 104C for provision to scan chains 106A, 106C, and respective switches 108A, 108C select input from bypass circuits 102A, 102C for provision to respective module scan-out ports 109A, 109C. It will be appreciated that in some embodiments, the first switches 110A-110C also may be coupled to receive data inputs (not shown) that may be selected during function mode operation.

Test stimuli data signals used to test module B are provided to module B via primary input pin ($SI_{pin}$) pass through N modules including module A en route to module B. Test response signals produced as a result of applying the test stimulus signals to module B pass through modules including module C en route to primary output signal pin ($SO_{pin}$). The N modules including module A and the M modules including module B are neighbor modules to module B. In order to simplify the description herein, only neighbor modules A and C are referred to, but it will be appreciated that the explanation refers to the other N-1 modules traversed by input stimulus signals and by the other M-1 modules traversed by test response signals. The N modules including module A that transmit stimulus signals from the primary input $SI_{pin}$ to module B include bypass circuitry operative to cause the input test signals to bypass these modules, i.e. to pass through these modules quickly without effecting testing of these N modules. The M modules including module C that transmit output signals from module B to the primary input $SI_{pin}$ also include bypass circuitry operative to cause the output test signals to bypass these M modules.

The respective toggle generators 104A, 104C produce a (non-test) toggle sequence to cause serially connected storage elements of the scan chains 106A, 106C to toggle at a selected toggle rate, e.g., at a toggle rate that provides a desired effect upon the module under test. Although some uses of the methods and apparatus described herein involve toggle rates used to mimic normal operation of neighbor modules through controlled rates, the methods and apparatus also can be used to toggle rates different from normal rates to either overstress or understress neighbors, by making them toggle more or less than in normal operation. As used herein the term 'toggle' refers to a change of logical state of a bi-stable storage device to a complementary logic state upon the occurrence of a clock signal. Examples of suitable bi-stable storage devices include a flip-flop or register that can store either a logical 0 state or a logical 1 state and that changes state in response to a clock pulse. Toggle generators 104A, 104C are configured to impart the toggle sequences, also referred to herein as a toggle input patterns, to the scan chains 106A, 106CA in a pattern to cause scan cells of the one or more scan chains to toggle at a selected rate. To impart a toggle signifies to impart a logic signal value to a logic input of a bi-stable storage device upon the occurrence of a clock signal that causes the device to change its logical output state. In some embodiments, the term 'toggle rate' signifies the total number of toggles of state elements within one or more scan chains within some selected time interval.

It will be appreciated that, typically, functional state elements (flip-flops) of a circuit are included in the scan chains. Also, it is atypical for dedicated flip-flops to be used for the scan chains, e.g., to be used solely as a scan chain element without another functional use. Hence, the toggle rate refers to the total number of toggles of state elements within some selected time interval independent from whether or not the state elements are coupled in scan chains. If the state elements within a module are connected in scan chains, then those scan chains can be used to achieve toggling of state elements at a desired toggle rate. However, use of scan chains to achieve a desired toggle rate is not required.

The toggle rate may be expressed as a percentage of the total number of sequential storage elements that toggle within the selected time interval. For example, imparting a toggle pattern 010101010 results in 100% toggle rate, as the bits toggle every clock cycle. For example, the toggle pattern 001100110011 results in a 50% toggle rate since bits toggle during 50% of the clock cycles. For example, a toggle pattern 001001001 results in 66% toggle rate since bits toggle during 66% of clock cycles.

The toggle rates of neighboring modules A and C are selected to control the effects of their toggling upon module B during scan mode operation of module B. Neighbor modules A and C can have overall toggle rates that are substantially the same or they may have different toggle rates. Toggle rates of modules A and C are determined by the collective toggling of state elements, e.g. flip-flops within their functional logic. Moreover, in some embodiments, the toggle rates of the neighbor modules A and C are controlled independently of each other and of module B. In some embodiments, toggle patterns and overall toggle rates of neighbor modules are selected to be realistic in that effect of state element toggling within neighboring modules upon a MUT such as power delivery (e.g., IR drop), thermal coupling and/or noise interference, is substantially the same as what it would be expected to be during actual normal functional operation, and hence prevent both test escapes ("false positives") and unjustified rejects ("false negatives").

Toggles imparted to neighboring modules in a pattern to cause scan cells to toggle at a selected toggle rate are referred to herein as neighbor toggles to distinguish these toggles from toggles occurring in the course of scan-in and scan-out to or from a scan chain.

Conversely, during testing of module A, scan chain 106A would be used to impart input test signals received from primary input $SI_{pin}$ to the core 101A of module A and to receive output test results signals from that core 101A for provision to $SO_{pin}$. In particular, during testing of module A, respective switch 108A selects input from scan chain 106A for provision to primary output signal pin $SO_{pin}$, and switch 110A selects input from primary input $SI_{pin}$. Similarly, during testing of module C, scan chain 106C would be used to impart input test signals received from primary input $SI_{pin}$ to the core 101C of module C and to receive output test results signals from that core 101C for provision to $SO_{pin}$. In particular, during testing of module C, respective switch 108C selects input from scan chain 106C for provision to primary output signal pin $SO_{pin}$, and switch 110C selects input from primary input $SI_{pin}$.

It will be appreciated that during the testing of Core A, Cores B and C might be in "neighbor toggle" mode. During the testing of Core B, Cores A and C might be in "neighbor toggle" mode. During the testing of Core C, Cores A and B might be in "neighbor toggle" mode.

Toggle Generator

Figure 3:
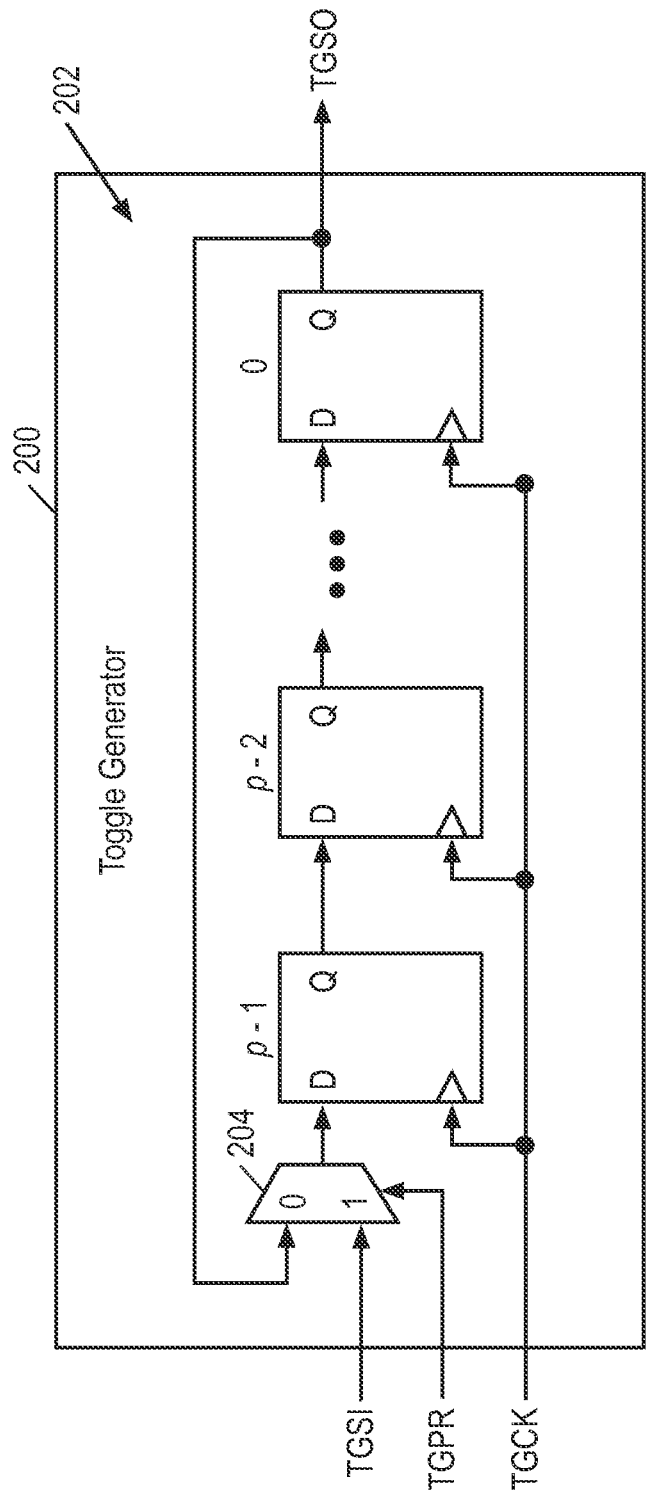
FIG. 3 is an illustrative schematic drawing of a toggle generator in accordance with some embodiments.

FIG. 3 is an illustrative schematic drawing of a programmable toggle generator 200 in accordance with some embodiments. A loop-back shift register (LBSR) 202 includes a chain of bi-stable storage elements. In some embodiments the chain comprises p D flip-flops (FFs) p−1 to 0 and multiplexer switch 204 coupled as shown. Signal TGCK is a free-running clock that can be connected to a test clock. Signal TGPR is a control signal to control the operation of switch 204. When TGPR has a first state value, the FFs are programmed by shifting in a sequence of p digital values via line TGSI. When TGPR has a second state value, a toggle signal sequence is fed back from the series-connected FFs to the switch 204. After the toggle generator 200 has been configured with state values, these state values are output on line TGSO repetitively in a sequence that is used to impart a toggle sequence to bi-stable storage elements of a scan chain(s) of the module (not shown) of which the toggle generator is constituent. Toggle switching activity of a neighbor module in which the toggle generator 200 is installed is determined by the length (p) of the LBSR and the sequence of values shifted in while programming it. As explained above, a given module can act as a neighbor module when it is not the actual module being tested.

Figure 4:
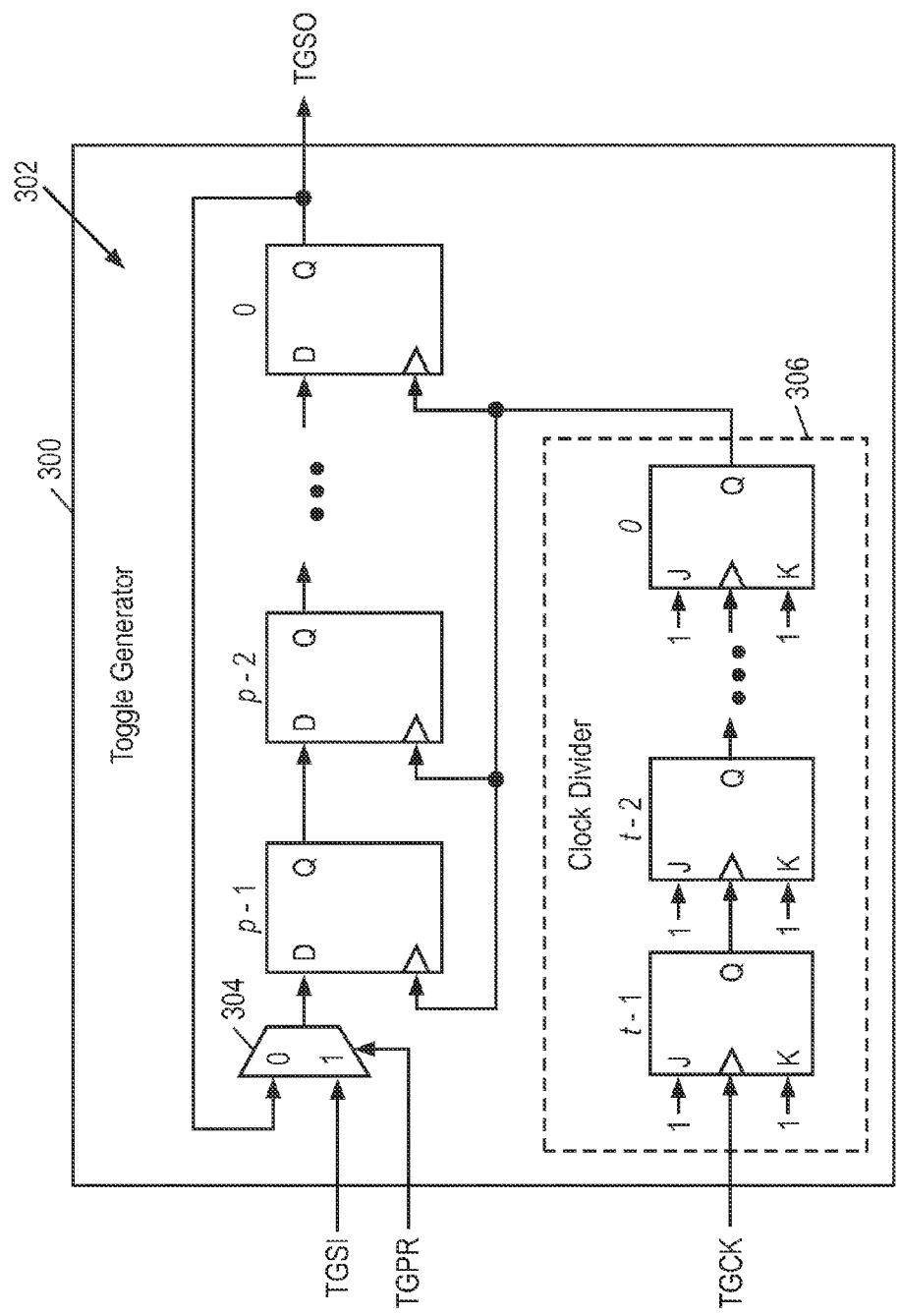
FIG. 4 is an illustrative schematic drawing of a programmable toggle generator in accordance with some embodiments.

FIG. 4 is an illustrative schematic drawing of a programmable toggle generator 300 in accordance with some embodiments. A loop-back shift register (LBSR) 302 includes p bi-stable storage elements, D flip-flops (FFs) in some embodiments, p−1 to 0 and multiplexer switch 304 coupled as shown. The operation of the LBSR 302 will be understood from the above discussion with reference to FIG. 3. A clock divider circuit effectively prolongs the length of a toggle switching sequence before it repeats, without requiring additional bi-stable storage elements in the LBSR 304. In some embodiments the clock divider circuit 306 includes a chain of multiple (t) JK FFs connected as shown. Persons skilled in the art will appreciate that a JK FF has behavior in which if it's J and K inputs both are high then the output Q will toggle from one state to the other. The TGCK signal is provided to the illustrative input FF of the chain. The Q output of each FF in the chain is coupled to the clock input of the next FF in the chain. A Q output of the last FF in the chain is coupled to the clock inputs of the D FFs of the LBSR 302. The clock divider circuit 306 of the illustrative embodiment has the effect of delaying delivery of each TGCK signal transition to the FFs of the LBSR 302 by a delay amount determined by a time required for the multiple (t) FFs of the clock divider 306 to change state in response to the clock transition. As such, the output of the clock divider 306 is a clock signal having a modified (reduced) clock frequency.

Figure 5:
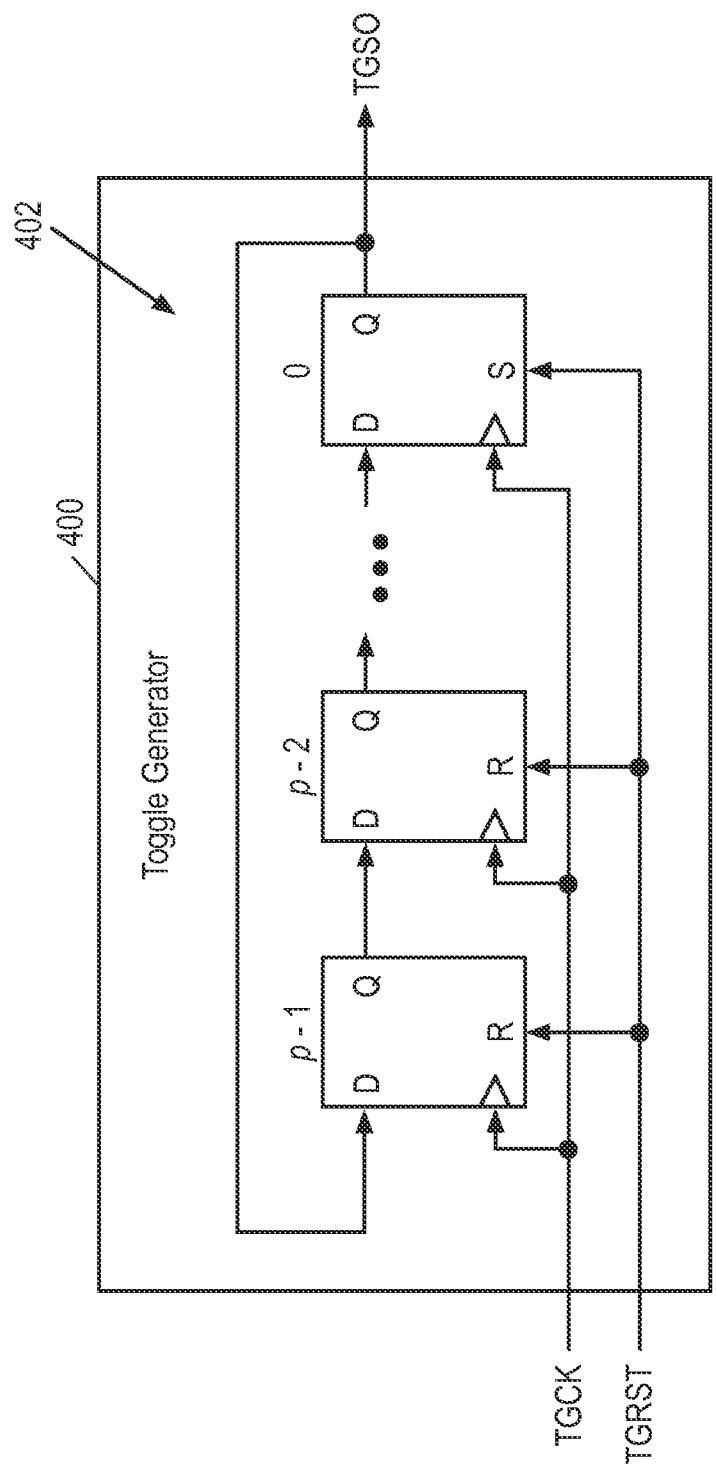
FIG. 5 is an illustrative schematic drawing of a fixed toggle generator in accordance with some embodiments.

FIG. 5 is an illustrative schematic drawing of a fixed toggle generator 400 in accordance with some embodiments. A loop-back shift register (LBSR) 402 includes p bi-stable storage elements, D flip-flops (FFs) in some embodiments, p−1 to 0 coupled as shown. Values in the LBSR 402 are initialized by asserting a TGRST signal to respective S or R programming terminals of each device in the chain. This effectively sets the LBSR flip-flops to logic level one (for 'set' flip-flops) or to logic level zero (for 'reset' flip-flops). Note that in the illustrative LBSR 402 the TGRST signal is provided to a reset (R) programming terminal of FFs p−1 and p−2 and is provided to a set (S) programming terminal of FF 0. Thus, FFs p−1 and p−2 are initialized to store the same fixed logical value, and FF 0 is initialized to store a fixed logical value opposite to that stored in FFs p−1 and −2. After values are initialized within the LBSR 402 and the TGRST signal is de-asserted, the fixed toggle generator 400 generates a repetitive toggle sequence on output TGSO, which can be imparted to bi-stable storage elements of the module's scan chain(s) (not shown).

Figure 6:
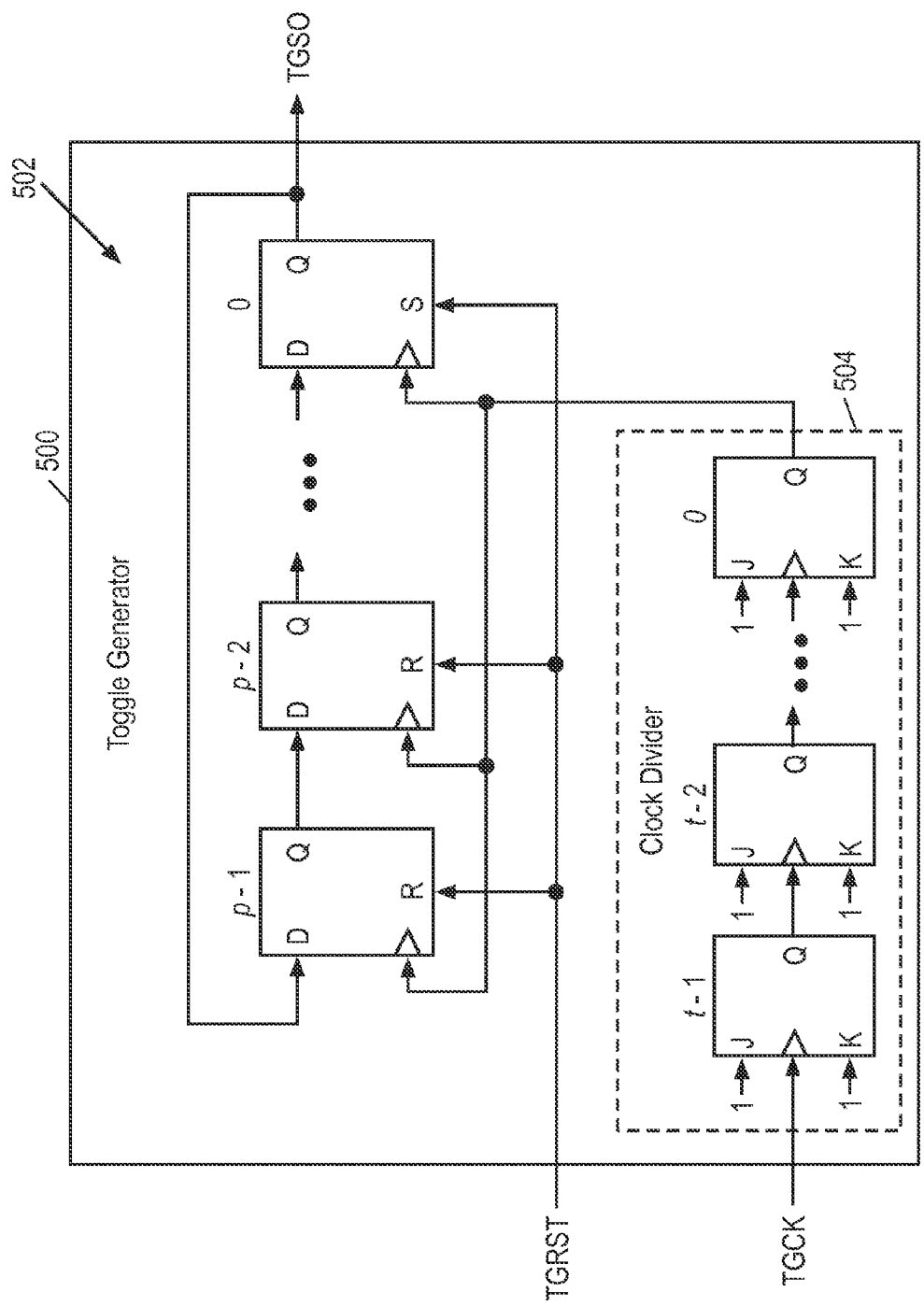
FIG. 6 is an illustrative schematic drawing of fixed toggle generator that includes a loop-back shift register coupled to a clock divider in accordance with some embodiments.

FIG. 6 is an illustrative schematic drawing of fixed toggle generator 500 that includes a loop-back shift register 502 coupled to a clock divider 504 in accordance with some embodiments. Operation of the LBSR 502 will be appreciated from the discussion of FIG. 5. Operation of the clock divider 504 will be appreciated from the discussion of FIG. 4.

Scan Testing a Module Under Test while Exercising Controlled Toggle Rate in Neighbor Modules Using Toggle Rate Generator and Circuitry Compliant with IEEE Standard 1500

Figure 7:
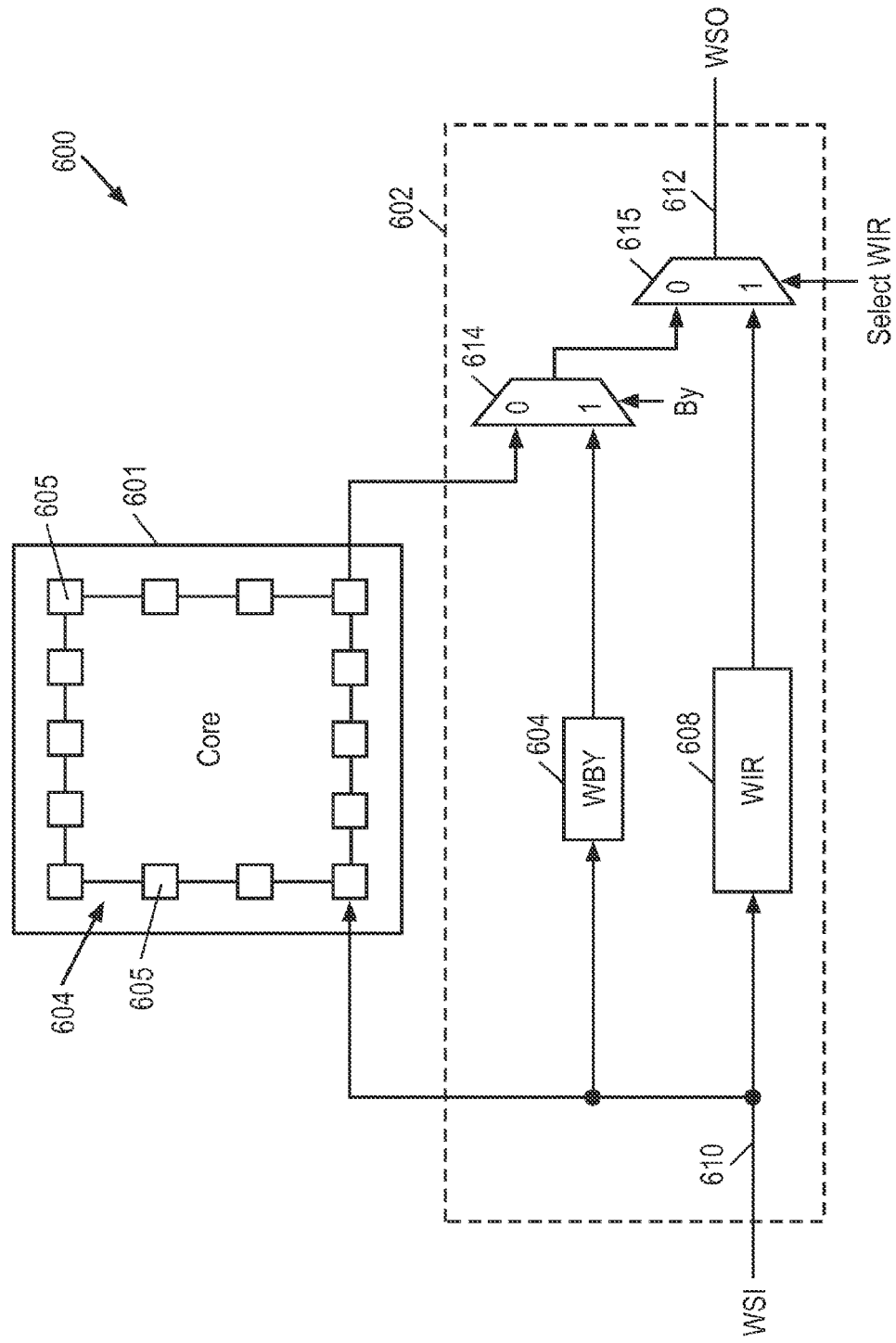
FIG. 7 is an illustrative drawing of a module that includes a core coupled to a serial test access mechanism circuit.

FIG. 7 is an illustrative drawing of a module 600 that includes a core coupled to a serial test access mechanism circuit 602. In some embodiments, the serial test access mechanism (TAM) circuit 602 is compliant with the IEEE Standard 1500. The IEEE Standard 1500 uses a 'wrapper architecture' to provide an interface to an SOC/SIC level TAM after a module is integrated into an SOC/SIC. An IEEE 1500 compliant wrapper includes several hardware components that support testing of a module embedded in a SOC/SIC. These include a wrapper boundary register (WBR) 604, a wrapper bypass register (WBY) 606 and a wrapper instruction register (WIR) 608. A wrapper serial input (WSI) line 610 receives serial input signals. A wrapper serial output (WSO) line 612 provides serial output signals. The switching states of multiplex switches 614, 615 under control of signals 'by' and SelectWIR generated by the WIR 608, determine WSO signals produced on line 612. See, IEEE Std. 1500— Standard for Embedded Core Test The wrapper boundary register (WBR) acts as an internal scan chain 604 impart test data to/from the MUT 601 in which the TAM circuitry 602 is installed. The scan chain 604 comprises a plurality of serial-connected scan cells 605, such as FFs or registers, used to deliver test data to the core circuitry and to receive test results data from the core circuitry. Persons skilled in the art will appreciate that in some embodiments, scan cells 605 within the scan chain 604 may act as scan storage devices for scanning test data in and out during test mode operation of the mode operation of the module 600, and also may act as functional storage devices that perform functional storage operations during function mode operation of the module 600. The wrapper bypass register (WBY) 606 provides a short path through the module for use in transfer of test data destined for use in testing a different module (not shown) or for use in transfer of test responses produced as a result of testing a different module (not shown). It will be understood that each module in an SOC/SIC may include TAM circuitry that includes a bypass register. Coupling together bypass registers of multiple modules enables transfer of test stimuli and responses across modules that are not being tested to and from a module that is being tested. The wrapper instruction register (WIR) 608 receives instructions to configure the TAM 602 into test modes and to initiate test activities. Details of the WBY and WIR will be readily understood by persons skilled in the art and are not important to the invention, and therefore, are not described herein.

FIGS. 8A-8D are illustrative drawings that portray operation of test access mechanism (TAM) circuitry 700 that includes a programmable toggle generator 702 when a module is configured as a neighbor module in accordance with some embodiments. The illustrative TAM 700 is compliant with IEEE 1500 Standard. An instance of the TAM circuitry 700 can be incorporated into each of multiple modules of a SOC/SIC. Bolded signal paths in FIGS. 8A-8D indicate active signal paths. A flow chart of the stages in the operation of the TAM 700 is included in each of FIGS. 8A-8D. Bolding of stages in the chart indicate stages corresponding to the different drawings.

Figure 8A:
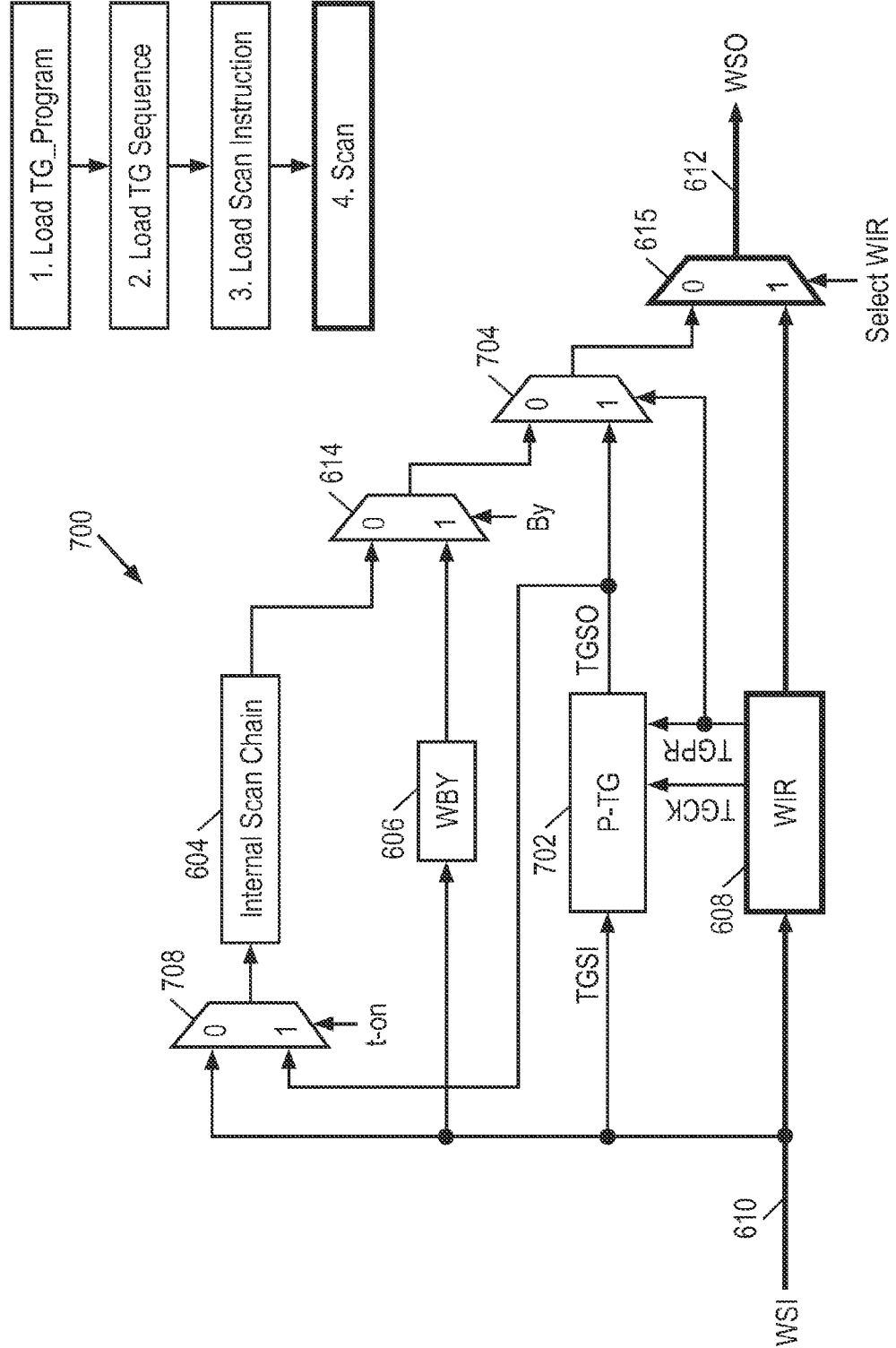
FIGS. 8A-8D are illustrative drawings that portray operation of test access mechanism circuitry that includes a programmable toggle generator when a module is configured as a neighbor module in accordance with some embodiments.

FIG. 8A illustrates an active signal path used during an instruction loading stage to cause loading of the programmable toggle generator 702 in accordance with some embodiments. The active signal path includes the WSI line 610 the WIR 608 and the WSO line 612. The WIR 608 acts as a local controller of the TAM 700, and the load instruction received by the WIR 608 instructs it to configure the TAM to load toggle values to the P-TG 702. The WIR 608 provides a SelectWIR signal to a control terminal of the multiplexer switch 615. The Select WIR signal has a state value to cause the switch to couple the WIR line 610 to the WSO line. It will be understood that multiple TAM circuits (not shown) within an SOC/SIC may be interconnected so as to pass programming instructions from one TAM to the next. Each TAM provides the instruction to its WIR and passes the instruction to the next TAM. In this manner, multiple TAMs can be programmed using their respective WIRs. For example, the illustrated TAM 600 may receive instructions on its WSI line 610 from another TAM (not shown) or from a primary input, and may forward the instructions on its WSO line 612 to another TAM or to a primary output (not shown).

Figure 8B:
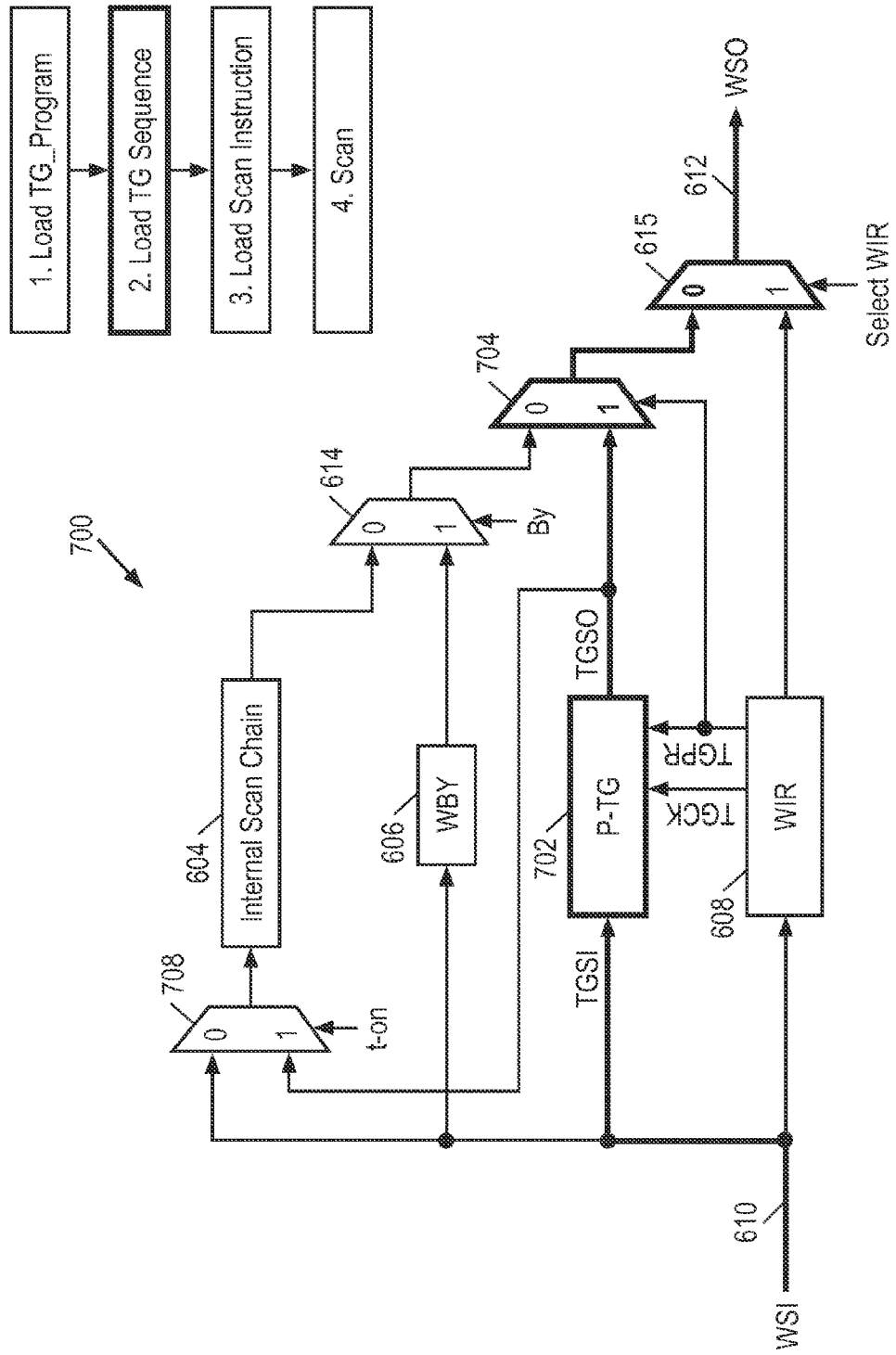

FIG. 8B illustrates an active signal path used to during programming of the programmable toggle generator in accordance with some embodiments. The active path includes the WSI line 610, programmable toggle generator 702 and the WSO line 612. A TGSI signal provided on WSI line 610 is used to program the state of the bi-stable storage elements, FFs in some embodiments, within the P-TG 702. A TGSO signal provided as an output of the P-TG 702 is provided on WSO line 612 for transmission to other modules (not shown) to program their TGs, for example. In some embodiments, internal circuitry of the P-TG 702 is configured as shown in FIG. 4. Referring again to FIG. 8B, the WIR 608 provides the TGCK signal and the TGPR signal to the P-TG 702. The Referring to FIGS. 3 and 8A, the TGPR signal has a state value causes multiplex switch 304 to select the TGSI signal that is received from another module or primary input (not shown). The TGPR signal also causes multiplex switch 704 to provide the TGSO signal to an input of multiplex switch 615, and the SelectWIR signal provided by the WIR 608 causes the multiplex switch 615 to select the signal provided by switch 704 for output on WSO line 612.

Figure 8C:
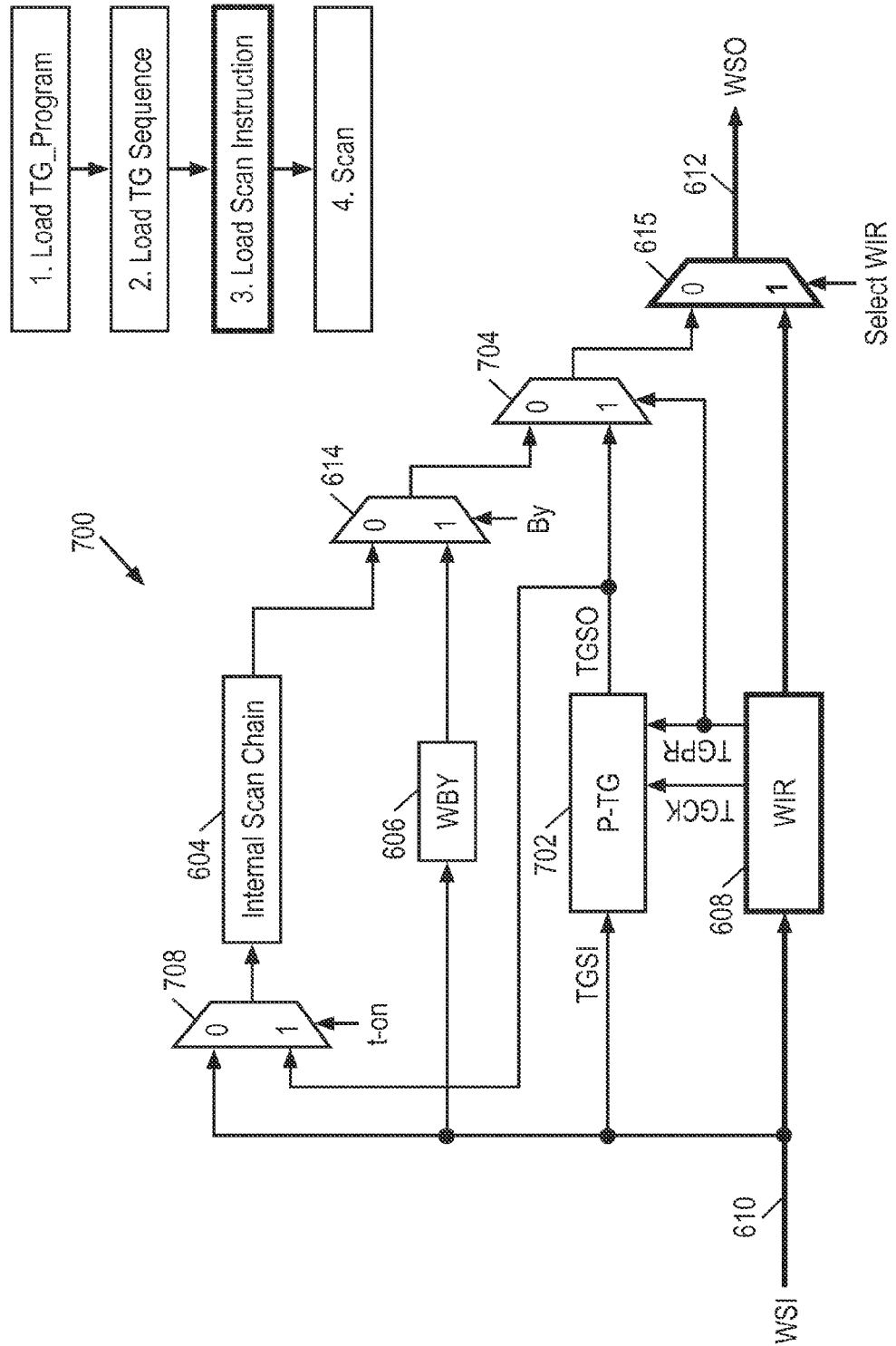

FIG. 8C illustrates an active signal path used during loading of a scan instruction in accordance with some embodiments. The active path includes the WSI line 610 the WIR 608 and the WSO line 612. As explained above, the WIR 608 acts as a local controller of the TAM 700. The scan instruction received by the WIR 608 causes it to configure the TAM 700 to enter a scan mode of operation. The WIR 608 provides the SelectWIR signal to the control terminal of the multiplexer switch 615 in a state value to cause the switch to couple the signal on the WIR line 610 to the WSO line. A scan instruction may be passed to TAMs of multiple modules so as to provide the scan instruction to the WIR of each of them.

Figure 8D:
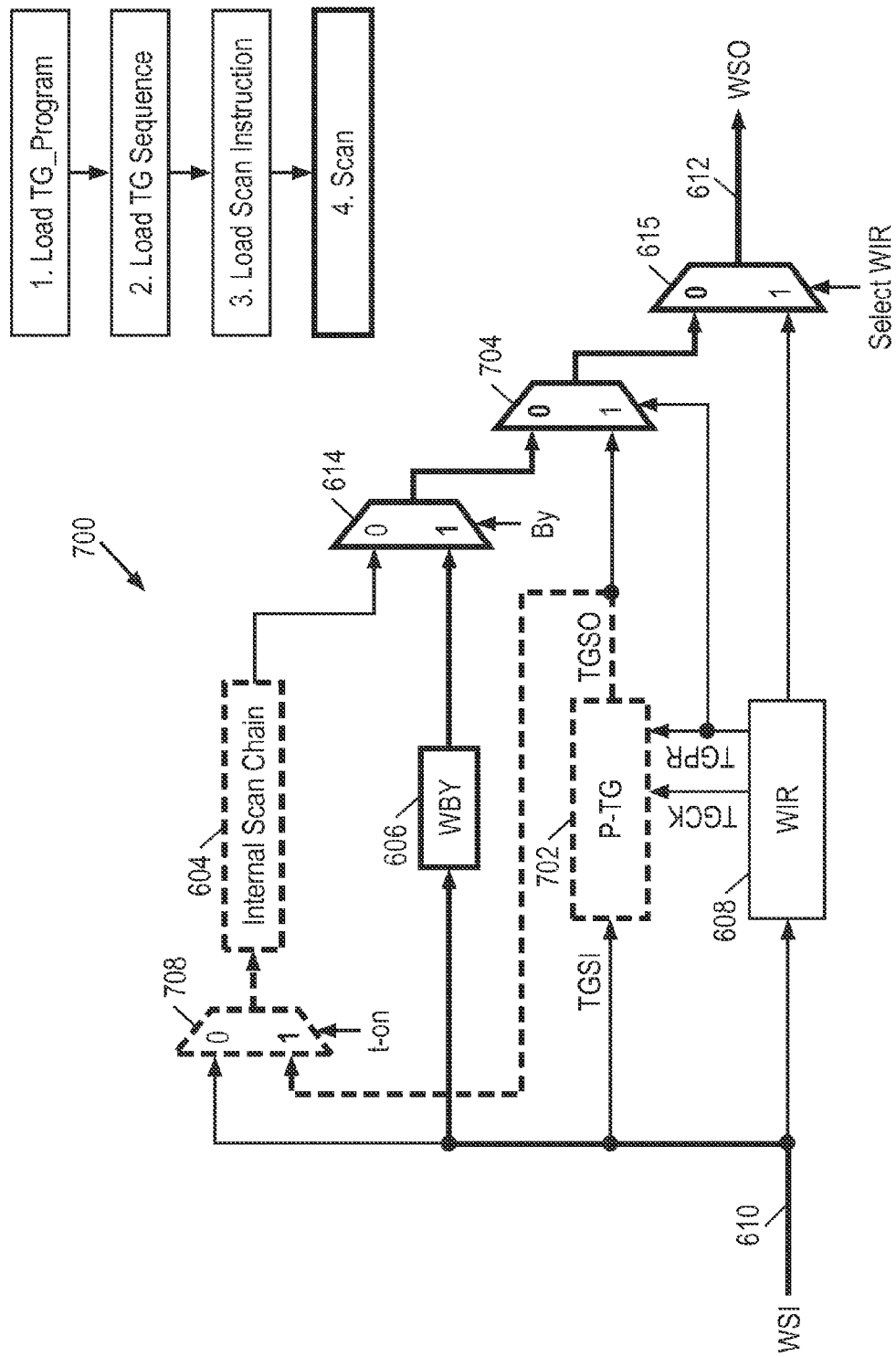

FIG. 8D illustrates two active signal paths within a neighbor module during scanning of test stimuli/responses used in testing a different module under test in accordance with some embodiments. The dashed lines indicate a toggle signal path used to cause FFs within the scan chain 604 to toggle at a selected rate (with a selected pattern) within the neighbor module. The toggle signal path includes the P-TG 606 and the internal scan chain 604. WIR 608 provides a state value for control signal 't-on' to cause multiplexer switch 708 to select the TGSO signal produced by the P-TG 702. The scan chain 604 propagates the toggle pattern generated by the P-TG 702. The bolded solid lines indicate a bypass signal path within the neighbor module. The bypass signal path includes WSI line 610, WBY 606 and WSO line 612. The WIR 608 provides a 'by' signal to multiplexer switch 614, the TGPR signal to switch 704 and a Select WIR signal to switch 615 having values to cause scan values provided on the WSI line 610 to be provided, via WBY 606, on WSO line 612. It will be appreciated that while toggle signals on the toggle switch path cause FFs in the scan chain 604 to toggle at a selected rate, test stimulus/response signals involved in the testing of a MUT (not shown) pass through the neighbor module via the bypass signal path.

Figure 9:
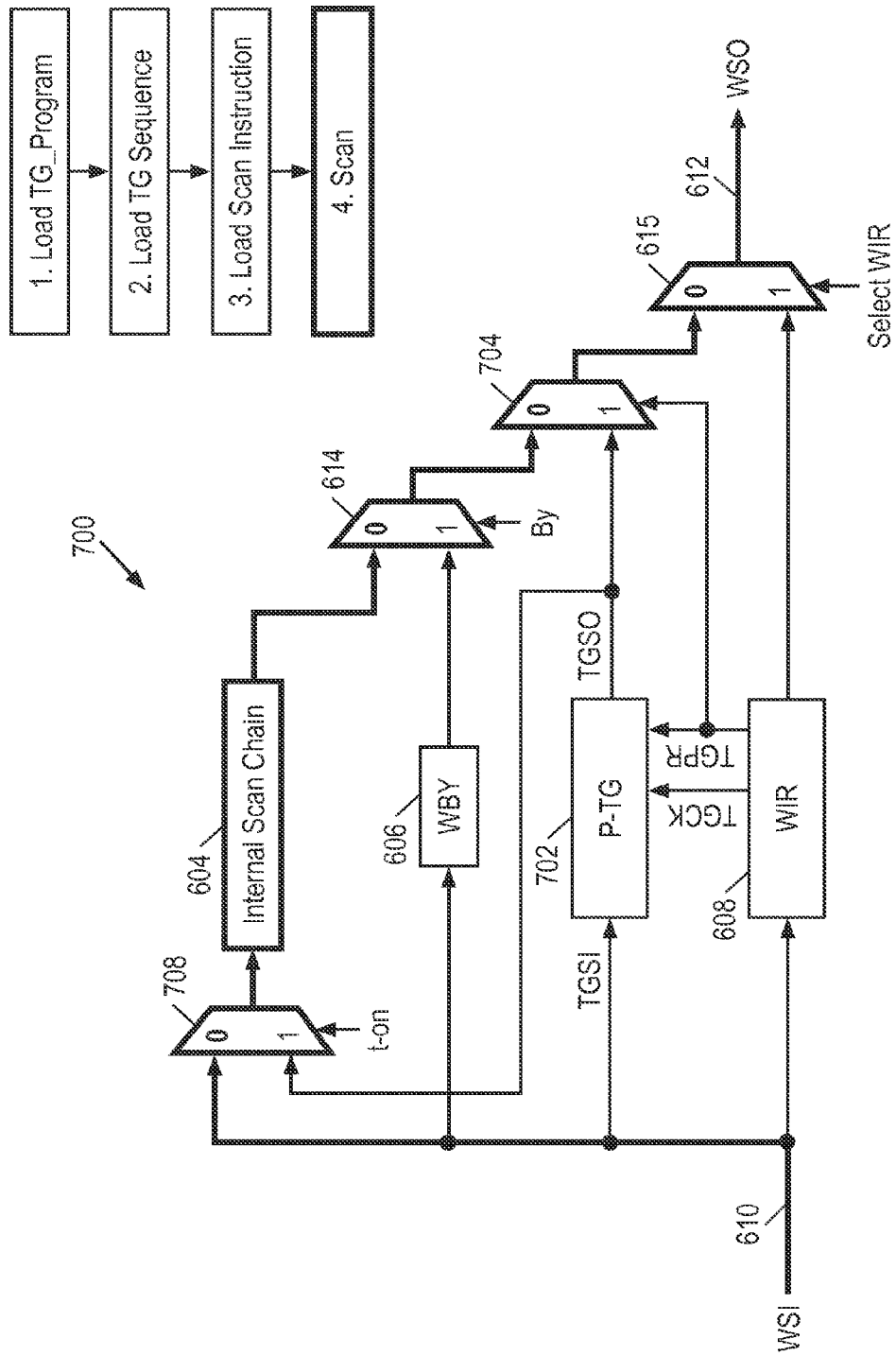
FIG. 9 is an illustrative drawing that portrays operation of test access mechanism circuitry that includes a programmable toggle generator when the module is configured as a Module-Under-Test in accordance with some embodiments.

FIG. 9 is an illustrative drawing that portrays operation of test access mechanism (TAM) circuitry 700 that includes a P-TG 702 when the module is configured in an InTest mode in accordance with some embodiments. The module 700 of FIG. 9 has an active scan path in which scan-in data is input on WSI line 610 is provided to the scan chain 604 and scan-out test responses are provided on WSO line 612. It will be appreciated that scan-in data may be provided by a primary input and may traverse TAMs of one or more other modules (not shown) before arriving at WSI line 610 and that scan-out responses may traverse one or more other modules (not shown) before arriving at a primary output. More particularly, neighbor modules to the module under test of FIG. 9 are configured as shown in FIG. 8D so as to pass scan-in values through their WBYs or to pass scan-out values through their WBYs depending upon their position in the SOC/SIC relative to the module containing the TAM 700 of FIG. 9. The WIR 608 provides the 'by' signal to multiplexer switch 614, the TGPR signal to switch 704 and a Select WIR signal to switch 615 having values to cause scan-out values provided by the scan chain 604 to be provided on WSO line 612.

Figure 10A:
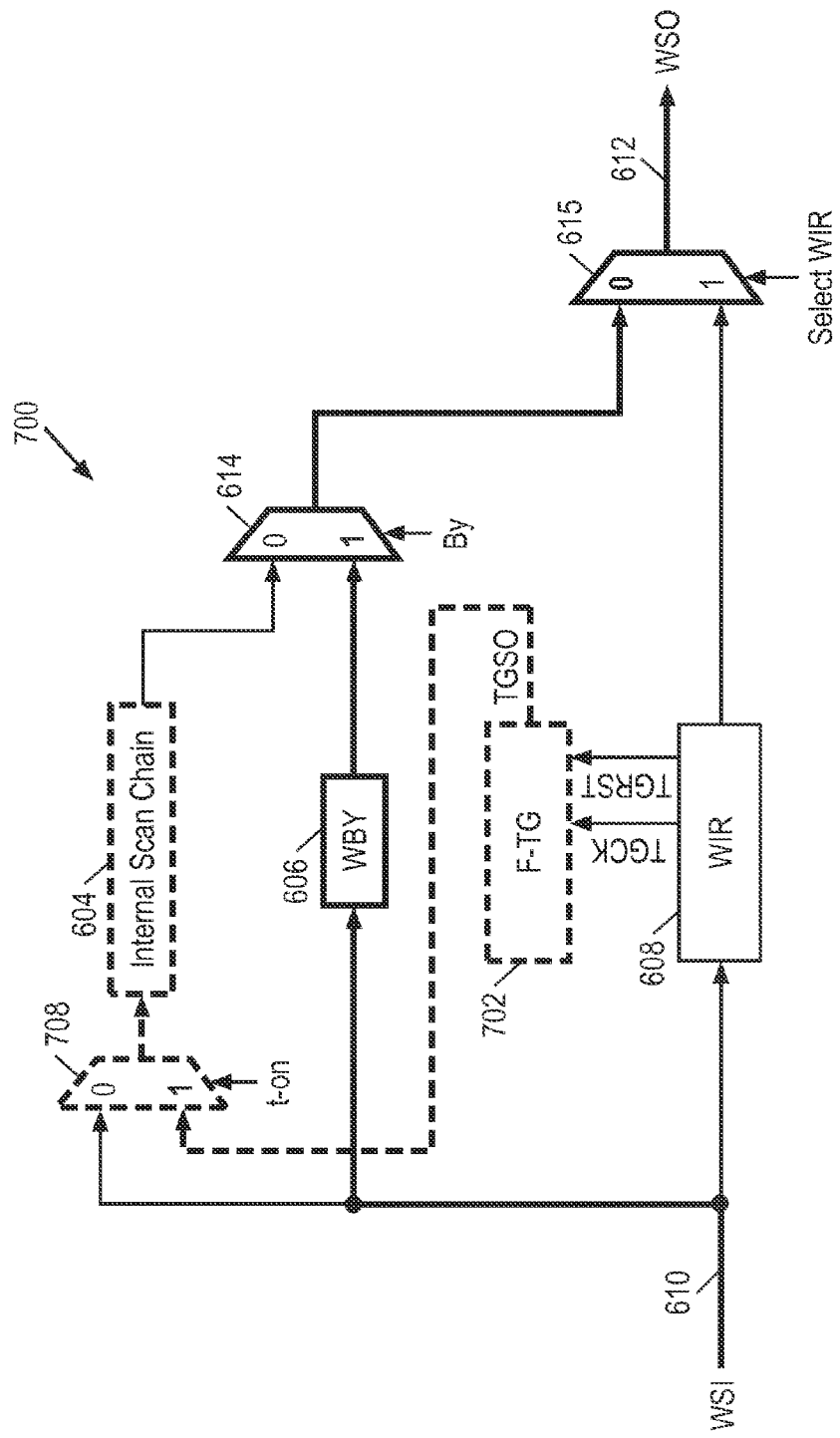
FIGS. 10A-10B are illustrative drawings of a test access mechanism that includes a fixed toggle generator and that portray operation when a module is configured as a neighbor module (FIG. 10A) and that portrays operation when the module is configured as a Module-Under-Test (FIG. 10B) in accordance with some embodiments.
Figure 10B:
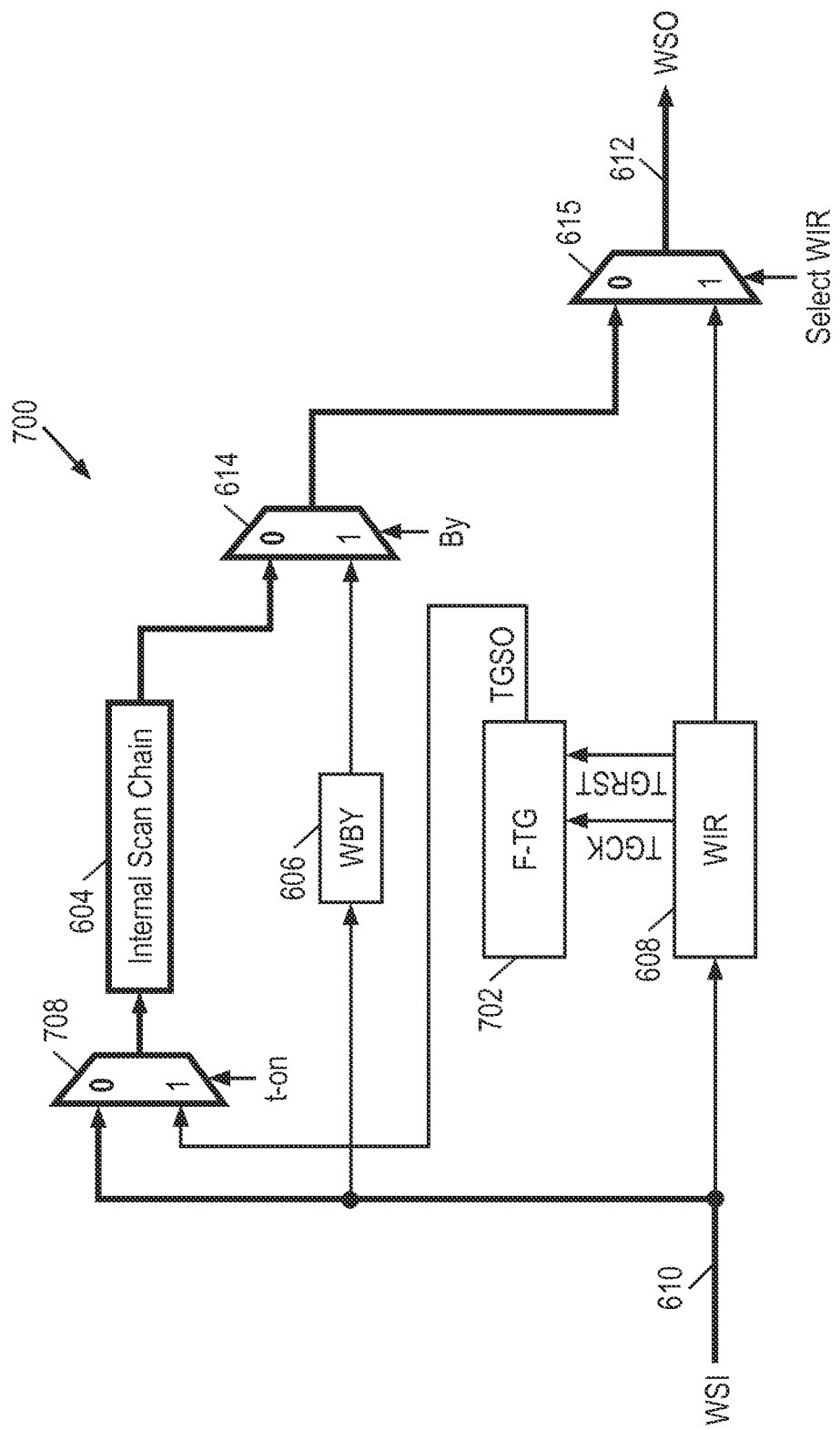

FIGS. 10A-10B are illustrative drawings of a TAM 900 that includes a fixed toggle generator (F-TG) 902 that portray operation of the TAM when a module is configured as a neighbor module (FIG. 10A) and that portrays operation of the TAM when the module is configured as a MUT in accordance with some embodiments (FIG. 10B). In some embodiments, internal circuitry of the F-TG 902 is configured as shown in FIG. 6. Operation of the TAM 900 when a module is configured as a neighbor module will be understood from the above description of FIG. 8D. Operation of the TAM 900 when the module is configured as a MUT will be understood from the above description of FIG. 9. As explained above, in some embodiments, the F-TG 902 is programmed in hardware using set/reset terminals of the FFs of the FF chain of F-TG 902. Thus unlike the TAM 700 of FIG. 8D, there is no requirement to pass TGSO signals from one TAM to the next, and the switch 704 is not included.

Supplying Toggles to Multiple Scan Chains

Figure 11:
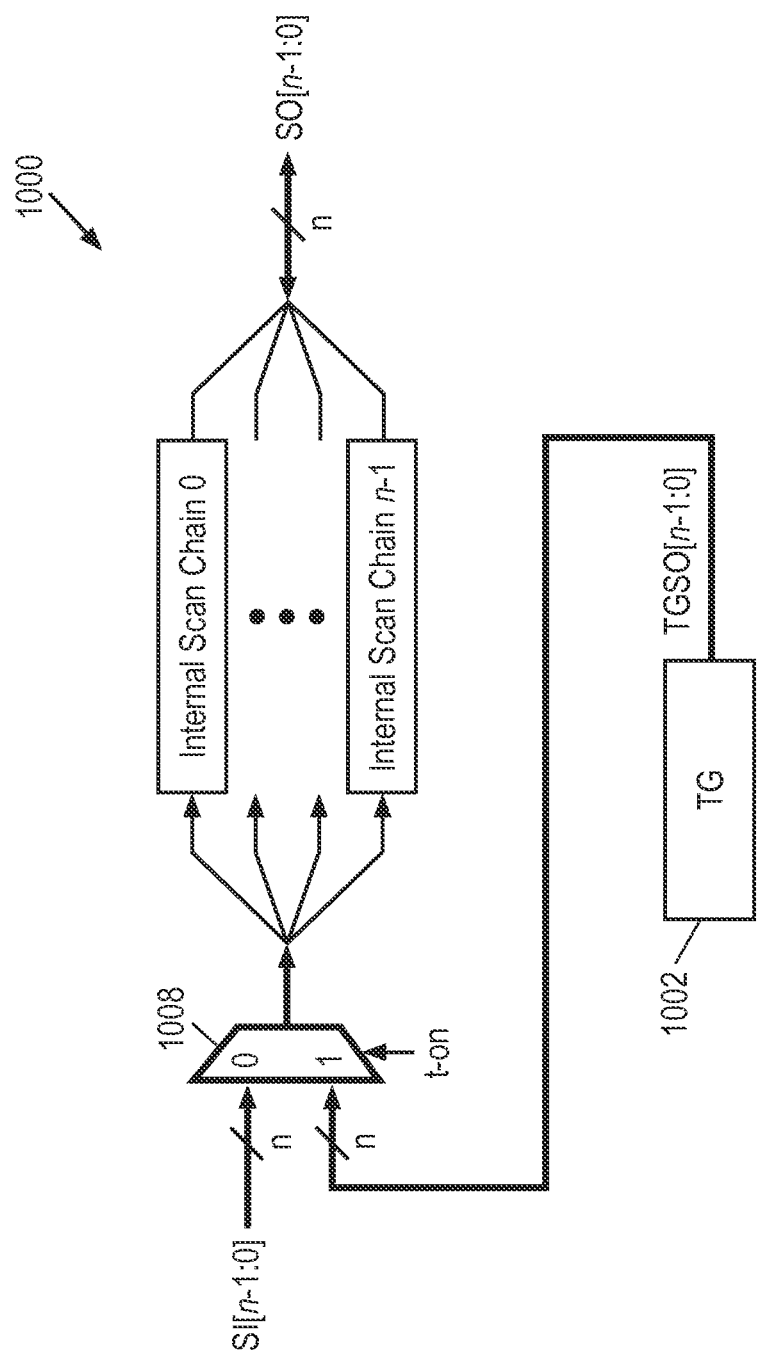
FIG. 11 is an illustrative schematic diagram showing portions of a test access mechanism includes a toggle generator coupled to impart toggle input to multiple scan chains in accordance with some embodiments.

FIG. 11 is an illustrative schematic diagram showing portions of a TAM 1000 that includes a toggle generator (TG) 1002 coupled to impart toggle input patterns to multiple scan chains in accordance with some embodiments. Other components of the TAM 1000 are omitted from the drawing in order to simplify the illustration of this multi-scan-chain implementation. The TG 1002 may be implemented as a programmable or fixed TG. Often, a module includes multiple shorter scan chains so as to achieve more rapid delivery of scan test stimuli/responses through simultaneous/parallel loading of the multiple shorter chains. Typically, multiple shorter chains can be loaded in parallel more rapidly than fewer longer chains. Persons skilled in the art will appreciate the operation of the above multi-scan chain embodiment from the explanations provided previously herein.

Scan Testing of Interconnect Logic Between Modules

Figure 12:
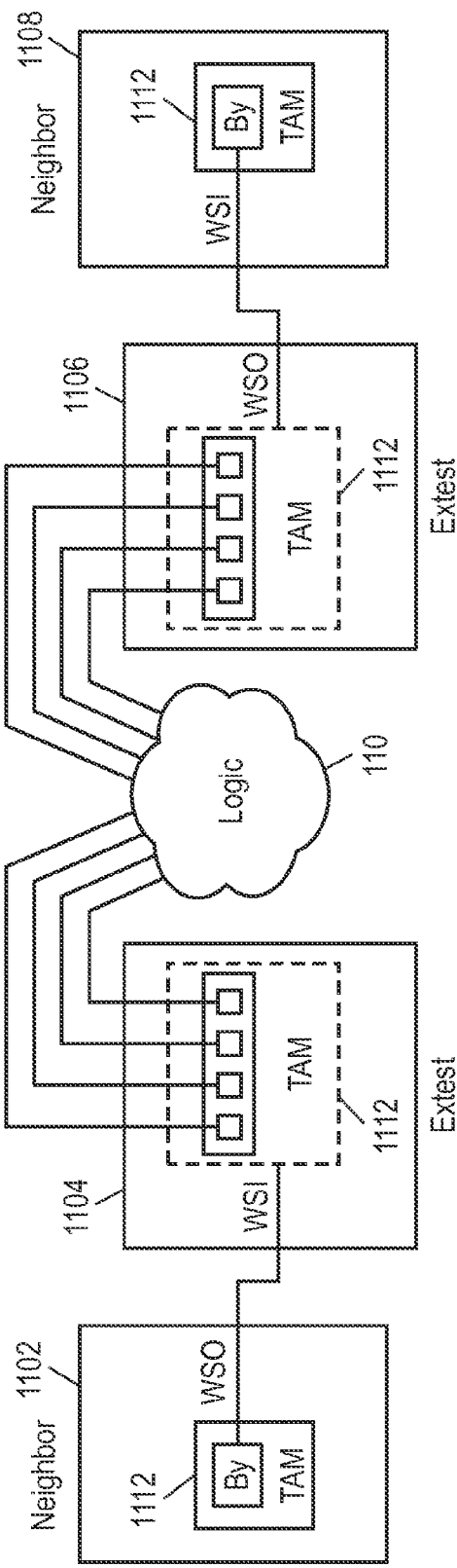
FIG. 12 is an illustrative drawing of an SOC that includes multiple modules configured for testing of external logic in accordance with some embodiments.

FIG. 12 is an illustrative drawing of an SOC/SIC 1100 that includes multiple modules 1104-1108 configured for testing of external logic 1110 in accordance with some embodiments. During the integration of multiple modules within an SOC/SIC, external logic 1110, sometimes referred to as user-defined logic (UDL), is created to couple the modules. Modules 1102-1108 include respective TAM circuitry 1112. In this illustrative example, during testing of the external logic 1110, sometimes referred to as 'extest', the TAM 1112 of module 1104 is configured to receive test data in its scan register 1114 and to provide the test data, perhaps in parallel, to the external logic 1110. Also during testing of the external logic 1110, the TAM 1112 of module 1106 is configured to receive test response data in its scan register 1114, perhaps in parallel, from the external logic 1110. The TAMs of modules 1102 and 1108 are configured to behave as in neighbor modules. The bypass register of the TAM 1112 of module 1102 provides test data to module 1104; and the bypass register of the TAM 1112 of module 1108 receives test response data from module 1106. The toggle generators of the TAMs 1112 of modules 1102, 1108 are active so as to switch at a selected rate as described above. It will be appreciated that modules 1104, 1106 may have additional neighbor modules, but only two are shown so not complicate the explanation.

Figure 13:
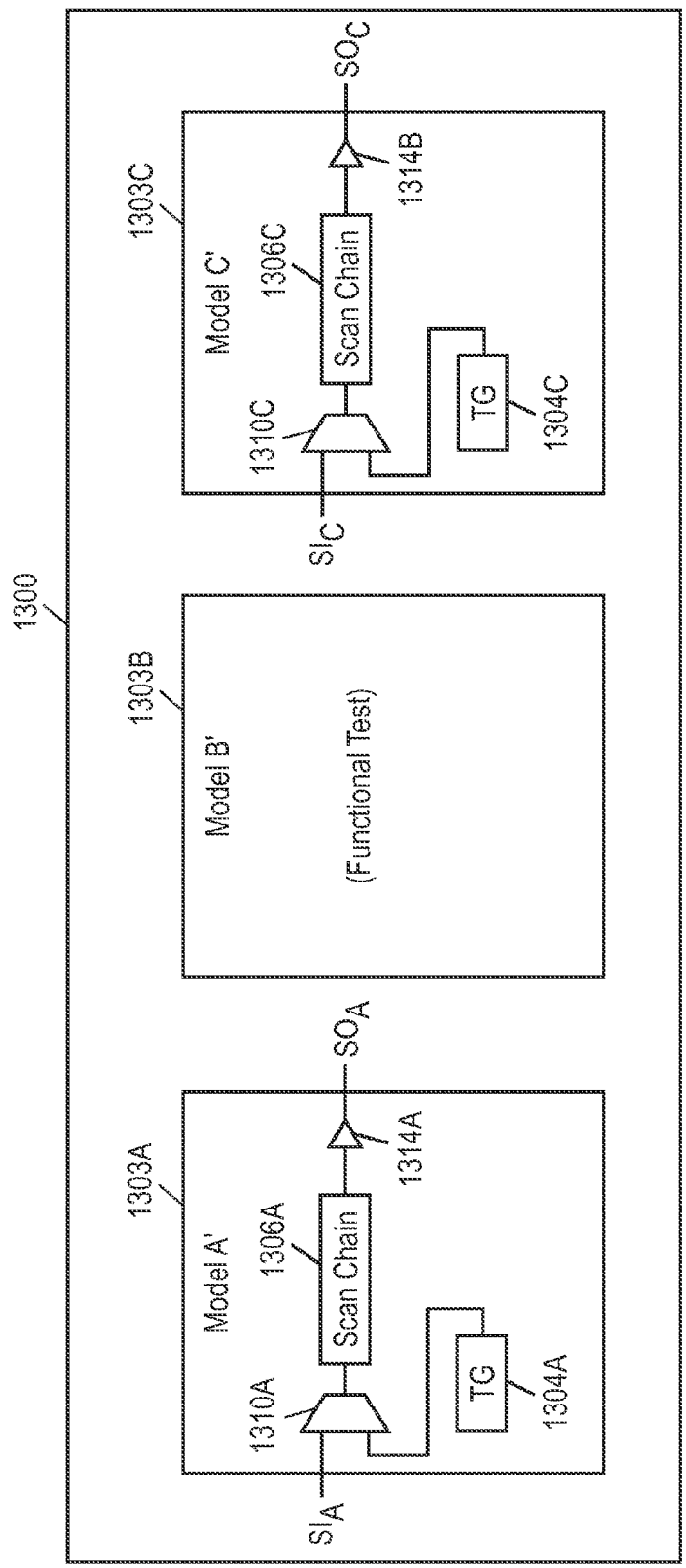
FIG. 13 is an illustrative drawing representing a modular IC configured for functional testing of a module under test while toggle generators cause neighbor modules to toggle at a controlled toggle rate in accordance with some embodiments.

Functional Testing of a Module Under Test while Exercising a Controlled Toggle Rate in Neighbor Modules FIG. 13 is an illustrative drawing representing a modular IC configured for functional testing of a module under test 1303B while toggle generators 1304A, 1304C cause neighbor modules 1303A, 1303C to toggle at a controlled toggle rate in accordance with some embodiments. "Functional testing" refers to testing a module while that module is operating in its normal, functional mode of operation. For logic designs, functional testing is different from "scan testing". In scan testing, stimuli sequences are brought into the circuit (and test responses out of the circuit) by loading (or unloading) them into (or out of) the scan chains. Thus, during scan testing, MUT is not in its normal mode of operation, but in "scan mode". For scan testing, the circuit requires special hardware provisions, in the form of scan chains and a scan-test mode. For functional testing, the scan infrastructure either is not present, or, if present, not used. By definition, functional test stimuli can only be applied at the primary inputs of the MUT, and likewise, functional test responses can only be observed at the primary outputs of the MUT. In scan testing, the test stimuli and responses can penetrate much deeper into the heart of the circuit, reaching all state elements (flip-flops). And that is the great benefit of scan design: the improved controllability and observability in the internals of the circuit. The price to be paid for scan testing is the extra required hardware (scan chains), and the fact that all test patterns need to be serially loaded/unloaded. For some modules, functional testing is the only option, e.g., if the module does not contain flip-flops (e.g., memories, which are tested through a sequence of functional write/read operations), or if scan design would impose an unacceptable area or performance penalty on the functional design.

Referring again to FIG. 13, The neighbor modules 1303A, 1303B include respective toggle generators 1304A, 1304C and scan chains 1306A, 1306C with scan cells that to toggle at a controlled toggle rate imparted by the toggle generators 1304A, 1304C. In some embodiments, the scan chains 1306A, 1306C also are employed for actual scan testing of modules 1303A, 1303C when at least one or the other of those modules is in the role of module under test. In that regard, in some embodiments, switches 1310A, 1310C couple whichever at least one or the other of scan chains 1306A, 1306C to a respective scan input pin $SI_A$ or $SI_C$ when it is used in a scan testing role. In some embodiments, modules 1303A, 1303C include output buffers 1314A, 1314C to receive output signals from scan chains 1306A, 1306C and to provide the output signals to respective primary output signal pins $SO_A$ and $SO_C$.

It will be appreciated that the module 1303B also may be equipped with a toggle generator (not shown) and a scan chain (not shown) similar to those of modules 1303A, 1303C to cause it to toggle in a controlled pattern and at a controlled rate when in the role of neighbor module. Moreover, it will be appreciated that in some embodiments, testing of modules 1303A, 1303C can be achieved selectively either through scan testing using scan chains 1306A, 1306C, or alternatively, through functional testing in which case the scan chains are not utilized even though they are available. Similarly, in some embodiments, when module 1303B is equipped with toggle generator and scan chain, it also can be tested through scan testing or functional testing.

Figure 14:
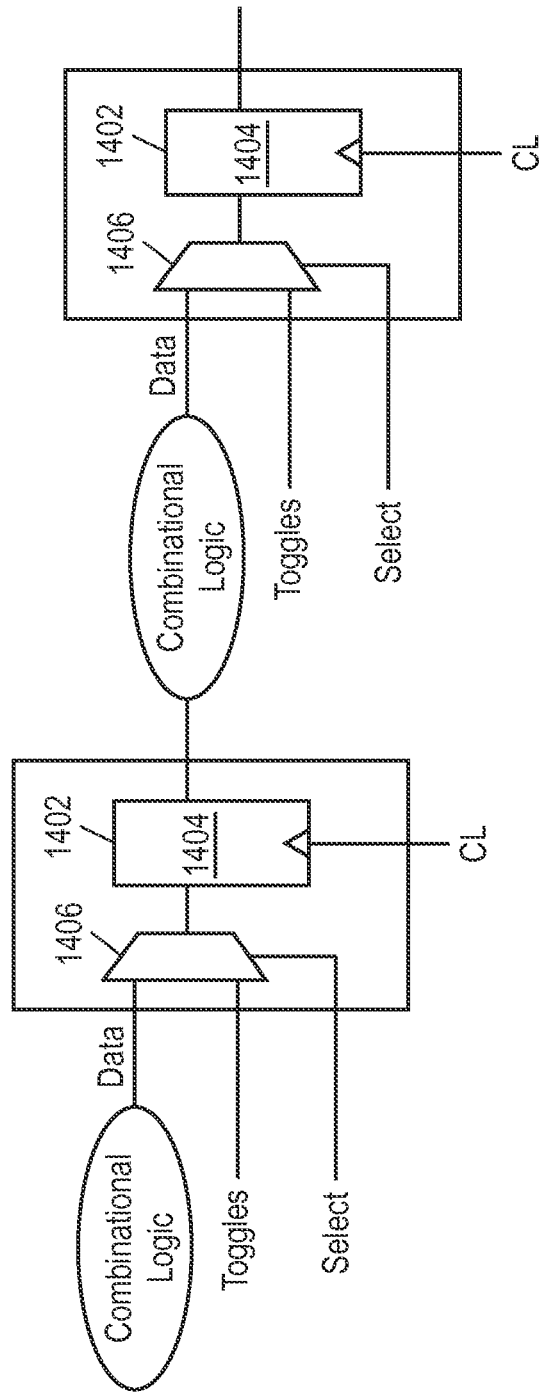
FIG. 14 is an illustrative drawing of a portion of an integrated circuit that includes functional cells that include switch circuitry to selectively couple the cells to receive data input signals or toggle input signals in accordance with some embodiments.

FIG. 14 is an illustrative drawing of a portion of an integrated circuit that includes functional cells 1402 and switch circuitry 1406 to selectively couple the cells to receive data input signals or toggle input signals in accordance with some embodiments. Each functional cell in the example comprises a dual purpose state element 1404 that can operate as a functional element in a circuit design during normal circuit operation, and alternatively, can operate as a toggle element during toggle generation operation. In some embodiments, each functional cell 1404 includes a flip-flop having a clock input CL and a two-way multiplexer (mux) 1406 to select between a system data D input (during function mode operation) and a toggle input (during toggle generation operation). The mux 1406 typically is controlled by a single control called select that selects between the function data and the toggle input. During toggle mode operation, the select signals cause at least some of the function cells tp select toggle data.

Figure 15:
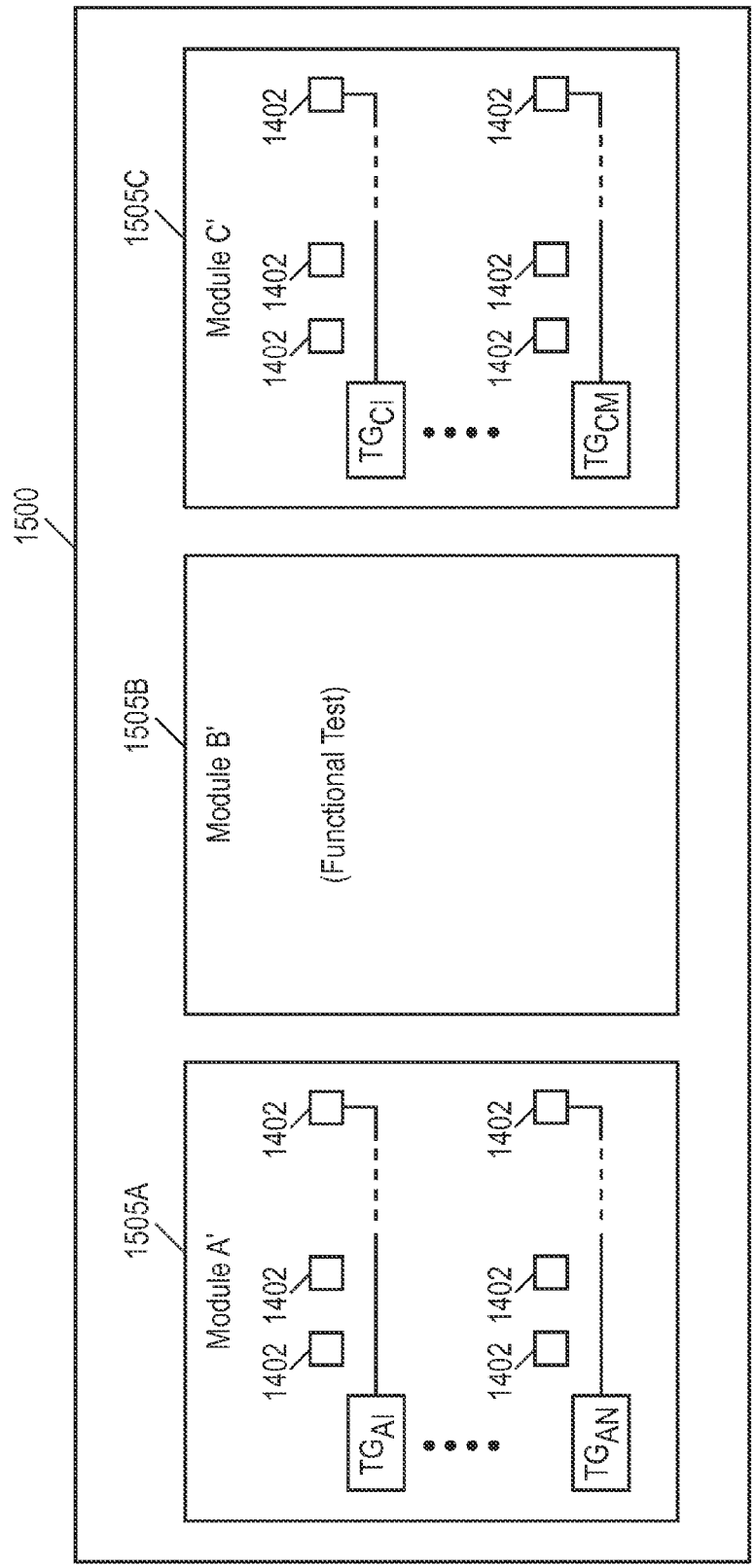
FIG. 15 is an illustrative drawing representing a modular IC configured for functional testing of a module under test while toggle generators cause neighbor modules to toggle at a controlled toggle rate in accordance with some embodiments.

FIG. 15 is an illustrative drawing representing a modular IC configured for functional testing of a module under test 1503B while toggle generators cause neighbor modules 1503A, 1503C to toggle at a controlled toggle rate in accordance with some embodiments. Each neighbor module 1505A, 1505C includes a plurality of functional cells 1402 interposed among combinational logic (not shown). Neighbor modules 1505A, 1505B include respective toggle generation circuitry $TG_{A1}$ to $TG_{AN}$ and $TG_{C1}$ to $TG_{CM}$ configured to cause at least some of their respective functional cells 1402 to toggle such that these modules 1505A, 1505C each imparts a realistic effect upon module 1505B, the module under test in this example. Details of the respective toggle generation circuitry in some embodiments will be readily understood by persons skilled in the art based upon the toggle generators described above. It will be appreciated of course that module 1505B also may include toggle generators and functional cells like those of modules 1505A, 1505C such that it also may act as a neighbor module that imparts a realistic effect upon one or more other modules under test. Conversely, it will be appreciated that one or the other of modules 1505A, 1505C may act as modules under test in which case their functional cells 1402 are configured to receive data inputs.

As yet another alternative (not shown) neighbor modules to a module under test are configured to have a functional mode in which functional cells toggle at an exact controlled rate required to have a desired effect upon a module under test without the use of toggle generator circuitry.

The foregoing description and drawings of embodiments in accordance with the present invention are merely illustrative of the principles of the invention. Therefore, it will be understood that various modifications can be made to the embodiments by those skilled in the art without departing from the spirit and scope of the invention, which is defined in the appended claims.

The invention claimed is:

1. A method to test a modular integrated circuit (IC) comprising:
   identifying a plurality of neighbor modules that neighbor a module-under-test (MUT) within the IC;
   selecting a controlled toggle rate for a first neighbor module of the plurality of neighbor modules, wherein the controlled toggle rate represents a number of toggles of a plurality of state elements of the first neighbor module during a time interval;
   generating a toggle pattern within the first neighbor module to cause a controlled toggle rate switching within the first neighbor module to affect testing of the MUT; and
   testing the MUT within the IC while switching the first neighbor module at the controlled toggle rate.

2. The method of claim I, wherein the controlled toggle rate within the first neighbor module is selected so that toggling within the first neighbor module has substantially the same effect upon operation of the MUT that operation of the first neighbor module would have during actual normal functional operation of the first neighbor module.

3. The method of claim 1, wherein the controlled toggle rate within the first neighbor module is selected so that toggling within the first neighbor module is selected so that toggling within the first neighbor module has a different effect upon operation of the MUT from What operation of the first neighbor module would have during actual normal functional operation of the first neighbor module.

4. The method of claim 1, wherein the controlled toggle rate within the first neighbor module is selected so that toggling within the first neighbor module has substantially the same power delivery effect upon operation of the MUT that operation of the first neighbor module would have during actual normal functional operation of the first neighbor module.

5. The method of claim 1 the controlled toggle rate within the first neighbor module is selected so that toggling within the first neighbor module has substantially the same thermal coupling effect upon operation of the MUT that operation of the first neighbor module would have during actual normal functional operation of the first neighbor module.

6. The method of claim 1, Wherein the controlled toggle rate within the first neighbor module is selected so that toggling within the first neighbor module has substantially the same noise interference effect upon operation of the MUT that operation of the first neighbor module would have during actual normal functional operation of the first neighbor module.

7. The method of claim 1, wherein the MUT and the neighbor module are included on the same die.

8. The method of claim 1, Wherein the MUT and the neighbor module are included on different dies in the same die stack.

9. The method of claim 1 further including:
   imparting the toggle pattern to one or more scan chains of the first neighbor module to cause the controlled toggle rate within the first neighbor module.

10. The method of claim 1, using a toggle generator to generate the toggle pattern causing the controlled toggle rate within the first neighbor module of the MUT.

11. The method of claim 1 further including:
using a shift register to impart toggles to one or more scan chains of the first neighbor module to cause the controlled toggle rate within the first neighbor module.

12. The method of claim 1 further including:
using a loopback shift register (LBSR) disposed on the first neighbor module to impart toggles to at least one scan chain of the first neighbor module to cause the controlled toggle rate within the first neighbor module;
shifting toggle values through the LBSR using a slower clock rate than a clock rate used by the at least one scan chain.

13. The method of claim 1, wherein testing of the MUT involves functional testing.

14. The method of claim 1, wherein testing of the MUT involves scan testing.

15. The method of claim 1, wherein testing of the MUT involves scan testing; and further including:
during scan-in of test pattern signals to a scan chain of a MUT, transmitting scan-in test pattern signals through the first neighbor module en route to the scan chain of the MUT.

16. The method of claim 15 further including:
during scan-in of test pattern signals to a scan chain of a MUT, transmitting scan-in test pattern signals through a storage element disposed within the first neighbor module en route to the scan chain of the MUT.

17. The method of claim 1, wherein testing of the MUT involves scan testing; and
wherein causing a controlled toggle rate within the first neighbor module includes imparting toggles to one or more scan chains of a first neighbor module in a toggle pattern to cause scan cells of the one or more scan chains of the first neighbor module to toggle at a first controlled toggle rate; and further including:
imparting toggles to one or more scan chains of a second neighbor module of the MUT in a toggle pattern to cause scan cells of the one or more scan chains of the second neighbor module to toggle at a second controlled toggle rate.

18. The method of claim 1, wherein testing of the MUT involves scan testing; and
wherein causing controlled toggle rate within the first neighbor module includes imparting toggles to one or more scan chains of the first neighbor module in a toggle pattern to cause scan cells of the one or more scan chains of the first neighbor module to toggle at a first controlled toggle rate; and further including:
imparting toggles to one or more scan chains of a second neighbor module of the MUT in a toggle pattern to cause scan cells of the one or more scan chains of the second neighbor module to toggle at the second controlled toggle rate;
transmitting scan-in test pattern signals through a storage element disposed within the first neighbor en route to a scan chain of the MUT; and
transmitting scan-out test pattern signals through a storage element disposed within the second neighbor module en route to a scan-out port.

19. A modular integrated circuit comprising:
a first module that includes a first scan chain, a scan-in port, a toggle generator and a first switch coupled to selectably couple one of (i) the scan-in port to a scan input of the first scan chain during scan mode operation of the first module, or (ii) a toggle generator output to a scan input of the first scan chain during scan mode operation of a second module to cause a controlled toggle rate switching in the first module during testing of the second module.

20. The circuit of claim 19, wherein the toggle generator includes:
a shift register that includes multiple bi-stable storage devices having clock terminals coupled to receive a clock signal; and
a second switch coupled to select a program signal input or a shift register output for provision as input to the shift register.

21. The circuit of claim 19, wherein the toggle generator includes:
a clock divider coupled to receive a clock signal and to provide a modified clock signal having a lower clock frequency;
a shift register that includes multiple bi-stable storage devices having clock terminals coupled to receive the modified clock signal; and
a second switch coupled to select a program signal input or a shift register output for provision as input to the shift register.

22. The circuit of claim 19, wherein the toggle generator includes:
a shift register that includes multiple bi-stable storage devices coupled in a chain in which an output of the chain is coupled to an input of the chain and having clock terminals coupled to receive a clock signal.

23. The circuit of claim 22, wherein the bi-stable storage devices of the shift register include D flip flops and the program terminals include set or reset terminals of respective D flip flops.

24. The circuit of claim 19, wherein the toggle generator includes:
a clock divider coupled to receive a clock signal and to provide a modified clock signal having a lower clock frequency;
a shift register that includes multiple bi-stable storage devices coupled in a chain in which an output of the chain is coupled to an input of the chain and having clock terminals coupled in common to receive the modified clock signal and having program terminals coupled to receive a program signal.

25. A modular integrated circuit comprising:
a first module that includes a first scan chain; and
a second module that is a neighbor of the first module and that includes:
one or more second scan chains,
a toggle generator, and
an input switch coupled to the one or more second scan chains to selectably couple one of (i) the toggle generator to a scan input of the one or more second scan chains during scan mode operation of the first module, or (ii) a scan-in port to the scan input of the one or more second scan chains during scan mode operation of the second module;
wherein the toggle generator includes a loop back shift register that is configured with state values to impart toggles to the one or more second scan chains in a pattern to cause scan cells of the one or more second scan chains to toggle at a toggle rate that causes controlled switching effects upon the first module during scan mode operation of the first module.

26. The circuit of claim 25, wherein the first module includes a first scan-in port;
  wherein the second module includes:
    a second scan-in port and a second scan-out port;
    bypass circuitry coupled to receive signals on the first scan-in port and to provide the received signals on the second scan out port;
  wherein during scan mode operation of the first module, the first scan-in port is coupled to the second scan-out port.

27. The circuit of claim 25 further including:
  a third module that is a neighbor of the first module and that includes one or more third scan chains and a toggle generator and an input switch coupled to selectably couple the toggle generator to the one or more third scan chains.
  wherein the toggle generator includes a loop back shift register that is configured with state values to impart toggles to the one or more third scan chains in a pattern to cause scan cells of the one or more third scan chains to toggle at a toggle rate that causes controlled switching effects upon the first module during scan mode operation of the first module.

28. The circuit of claim 25, wherein the first module includes a first scan-out port;
  wherein the third module includes:
    a third scan-in port and a third scan-out port;
    bypass circuitry coupled to receive signals on the third scan-in port and to provide the received signals on the third scan out port;
  wherein during scan mode operation of the first module, the first scan-out port is coupled to the third scan-in port.

29. An integrated circuit comprising:
  a plurality of modules, comprising:
    a module-under-test MUT) of the plurality of modules:
    a neighbor module of the plurality of modules that includes a toggle generator and a plurality of state elements, wherein the neighbor module neighbors the MUT;
  wherein the toggle generator is configured to impart a toggle pattern to the plurality of state elements to cause toggling within the neighbor module at a controlled toggle rate during testing of the MUT; and
  wherein the controlled rate of toggling within the neighbor module is selected so that toggling within the neighbor module has substantially the same effect upon operation of the MUT during testing that operation of the neighbor module is expected to have during actual normal functional operation of the first neighbor module.

30. The circuit of claim 29, wherein the plurality of state elements are coupled in one or more scan chains; and
  wherein the toggle generator includes a shift register configured to impart toggles to one or more scan chains of the neighbor module to cause the controlled toggle rate within the neighbor module.

31. The circuit of claim 29, wherein the toggle generator includes:
  a shift register that includes multiple bi-stable storage devices coupled in a chain in which an output of the chain is coupled to an input of the chain and having clock terminals coupled to receive a clock signal and having program terminals coupled to receive a program signal.

32. The circuit of claim 29, wherein the toggle generator includes:
  a clock divider coupled to receive a clock signal and to provide a modified clock signal having a lower clock frequency;
  a shift register that includes multiple bi-stable storage devices coupled in a chain in which an output of the chain is coupled to an input of the chain and having clock terminals coupled in common to receive the modified clock signal and having program terminals coupled to receive a program signal.

* * * * *